(12) United States Patent
Mizuashi et al.

(10) Patent No.: US 12,367,834 B2
(45) Date of Patent: Jul. 22, 2025

(54) DISPLAY DEVICE

(71) Applicant: Sony Semiconductor Solutions Corporation, Kanagawa (JP)

(72) Inventors: Takato Mizuashi, Kanagawa (JP); Kouichi Hashikaki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/838,068

(22) PCT Filed: Mar. 8, 2023

(86) PCT No.: PCT/JP2023/008728
§ 371 (c)(1),
(2) Date: Aug. 13, 2024

(87) PCT Pub. No.: WO2023/189312
PCT Pub. Date: Oct. 5, 2023

(65) Prior Publication Data
US 2025/0191534 A1    Jun. 12, 2025

(30) Foreign Application Priority Data

Mar. 29, 2022  (JP) ................................. 2022-054137

(51) Int. Cl.
*G09G 3/3233*     (2016.01)
(52) U.S. Cl.
CPC ..................... *G09G 3/3233* (2013.01); *G09G 2300/0819* (2013.01); *G09G 2300/0852* (2013.01);

(Continued)

(58) Field of Classification Search
None
See application file for complete search history.

(56) References Cited

U.S. PATENT DOCUMENTS

| 2006/0290638 | A1* | 12/2006 | Kang | .................. G09G 3/3688 345/98 |
| 2008/0136806 | A1* | 6/2008 | Lee | .......................... G09G 3/36 345/212 |

(Continued)

FOREIGN PATENT DOCUMENTS

| JP | 2013054161 A | 3/2013 |
| JP | 2014052535 A | 3/2014 |

(Continued)

OTHER PUBLICATIONS

International Search Report (PCT/ISA/210), International Application No. PCT/JP2023/008728, dated Apr. 18, 2023.

*Primary Examiner* — Dorothy Harris
(74) *Attorney, Agent, or Firm* — Michael Best & Friedrich LLP

(57) ABSTRACT

Display devices with reduced power consumption are disclosed. In one example, a display device includes pixel circuits respectively connected to data lines in a first direction, a first voltage output unit that generates a first ramp wave voltage whose voltage level changes with time, and a first ramp wiring that supplies the first ramp wave voltage generated by the first voltage output unit to each of a plurality of data lines of a first group, in which at least two data lines of the plurality of data lines are brought into a conductive state before outputting the first ramp wave voltage to the first ramp wiring.

18 Claims, 34 Drawing Sheets

(52) U.S. Cl.
CPC ............... *G09G 2300/0861* (2013.01); *G09G 2310/08* (2013.01); *G09G 2330/021* (2013.01)

(56) References Cited

U.S. PATENT DOCUMENTS

| | | | | |
|---|---|---|---|---|
| 2011/0164006 A1* | 7/2011 | Son | ...................... | G09G 3/3614 |
| | | | | 345/204 |
| 2013/0076706 A1* | 3/2013 | Andou | .................. | G09G 3/3648 |
| | | | | 345/204 |
| 2013/0083093 A1* | 4/2013 | Kim | ..................... | G09G 3/3258 |
| | | | | 345/212 |
| 2017/0169796 A1 | 6/2017 | Tai | | |
| 2018/0247586 A1* | 8/2018 | Vahid Far | ............ | G09G 3/3216 |
| 2020/0335046 A1* | 10/2020 | Ryu | ..................... | G09G 3/3233 |
| 2022/0392384 A1* | 12/2022 | Cho | ........................ | G09G 3/20 |
| 2024/0185814 A1* | 6/2024 | Oh | ........................ | G09G 3/3685 |

FOREIGN PATENT DOCUMENTS

| | | | |
|---|---|---|---|
| JP | 2018530795 A | 10/2018 | |
| JP | 2021039297 A | 3/2021 | |
| WO | 2010137268 A1 | 12/2010 | |
| WO | 2014046029 A1 | 3/2014 | |

\* cited by examiner

DISPLAY DEVICE

TECHNICAL FIELD

The present disclosure relates to a display device.

BACKGROUND ART

A display device is used in which pixels each including an organic electro luminescence (EL) display element are arranged in a two-dimensional matrix. This organic EL display element is a self-luminous display element, and has advantages such as higher image quality and higher response speed than a liquid crystal panel. In addition, in such a liquid crystal panel, luminance information of an image to be displayed is supplied as an image signal depending on the degree of slope of the ramp waveform voltage.

CITATION LIST

Patent Document

Patent Document 1: Japanese Patent Application Laid-Open No. 2014-52535

SUMMARY OF THE INVENTION

Problems to be Solved by the Invention

However, as the density of the pixel circuits constituting the display device increases, a large current supply capability is also required for the power supply applied to the pixel drive circuit. In addition, suppression of power consumption of the display device is also required.

Therefore, the present disclosure provides a display device capable of suppressing power consumption.

Solutions to Problems

In order to solve the above problem, according to the present disclosure,
  there is provided a display device including:
    a plurality of pixel circuits respectively connected to a plurality of data lines in a first direction;
    a first voltage output unit that generates a first ramp wave voltage whose voltage level changes with time; and
    a first ramp wiring that supplies the first ramp wave voltage generated by the first voltage output unit to each of a plurality of data lines of a first group,
    in which at least two data lines of the plurality of data lines are brought into a conductive state before outputting the first ramp wave voltage to the first ramp wiring.
  The pixel circuit may include a light emitting unit and a drive circuit for driving the light emitting unit,
    the drive circuit may include a drive transistor and a capacitance unit, and
    a voltage corresponding to an image signal may be held in the capacitance unit.
  The display device may further include
    a first switch that brings at least two data lines of the plurality of data lines into a conductive state or a non-conductive state,
    in which at least two data lines among the plurality of data lines may be brought into a conductive state by the first switch.
  The display device may further include:
    a second voltage output unit that generates a second ramp wave voltage whose voltage level changes with time; and
    a second ramp wiring that supplies the second ramp wave voltage generated by the second voltage output unit to each of a plurality of data lines of a second group different from the plurality of data lines of the first group.
  The display device may further include
    a second switch that brings the first ramp wiring and the second ramp wiring into a conductive state or a non-conductive state,
    in which at least two data lines among the plurality of data lines may be brought into a conductive state by the second switch.
  The display device may further include
    a plurality of drive control lines that drives the drive transistor,
    in which each of the plurality of drive control lines may be connected to the drive transistor of each of a plurality of pixel circuits arranged in a second direction different from the first direction,
    the plurality of data lines of the first group may be connected to the pixel circuit including the drive transistor connected to at least a first drive control line among the plurality of drive control lines, and
    the plurality of data lines of the second group may be connected to at least a second drive control line different from the first drive control line among the plurality of drive control lines.
  The first ramp wave voltage and the second ramp wave voltage may be output at different timings.
  The voltage corresponding to the image signal may be set using the first ramp wave voltage.
  The first switch may be brought into a conductive state in a period according to the image signal.
  The first ramp wave voltage may include a DC voltage for initialization and a ramp wave voltage for setting the image signal.
  The first ramp wave voltage may include a ramp wave voltage for initialization and a ramp wave voltage for setting the image signal.
  The first ramp wave voltage may include a ramp wave voltage for initialization and a ramp wave voltage for setting the image signal, and the second ramp wave voltage includes a ramp wave voltage for initialization and a ramp wave voltage for setting the image signal, and
    the second ramp wave voltage may output a ramp wave voltage for setting the image signal according to timing at which the first ramp wave voltage outputs a voltage for initialization.
  At least two data lines among the plurality of data lines may be brought into a conductive state during a precharge period of a ramp wave voltage for initialization.
  At least two data lines among the plurality of data lines may be brought into a conductive state during a precharge period of a ramp wave voltage for setting the image signal.
  The ramp wave voltage for initialization and the ramp wave voltage for setting the image signal may be alternately output at a predetermined cycle.
  The first ramp wave voltage may be output to the first ramp wiring via a first buffer, and the second ramp wave voltage may be output to the second ramp wiring via a second buffer.
  At least one of the first buffer or the second buffer may be set to high impedance in a period in which the two data lines are brought into a conductive state.

In a case where the two data lines are brought into a conductive state, accumulated charges of the capacitance unit included in the pixel circuit connected to each of the two data lines may be shared.

MODE FOR CARRYING OUT THE INVENTION

Hereinafter, embodiments of a display device will be described with reference to the drawings. Although main components of the display device will be mainly described below, the display device may have a component or function that is not illustrated or described. The following description does not exclude components and functions that are not depicted or described.

First Embodiment

Figure 1:
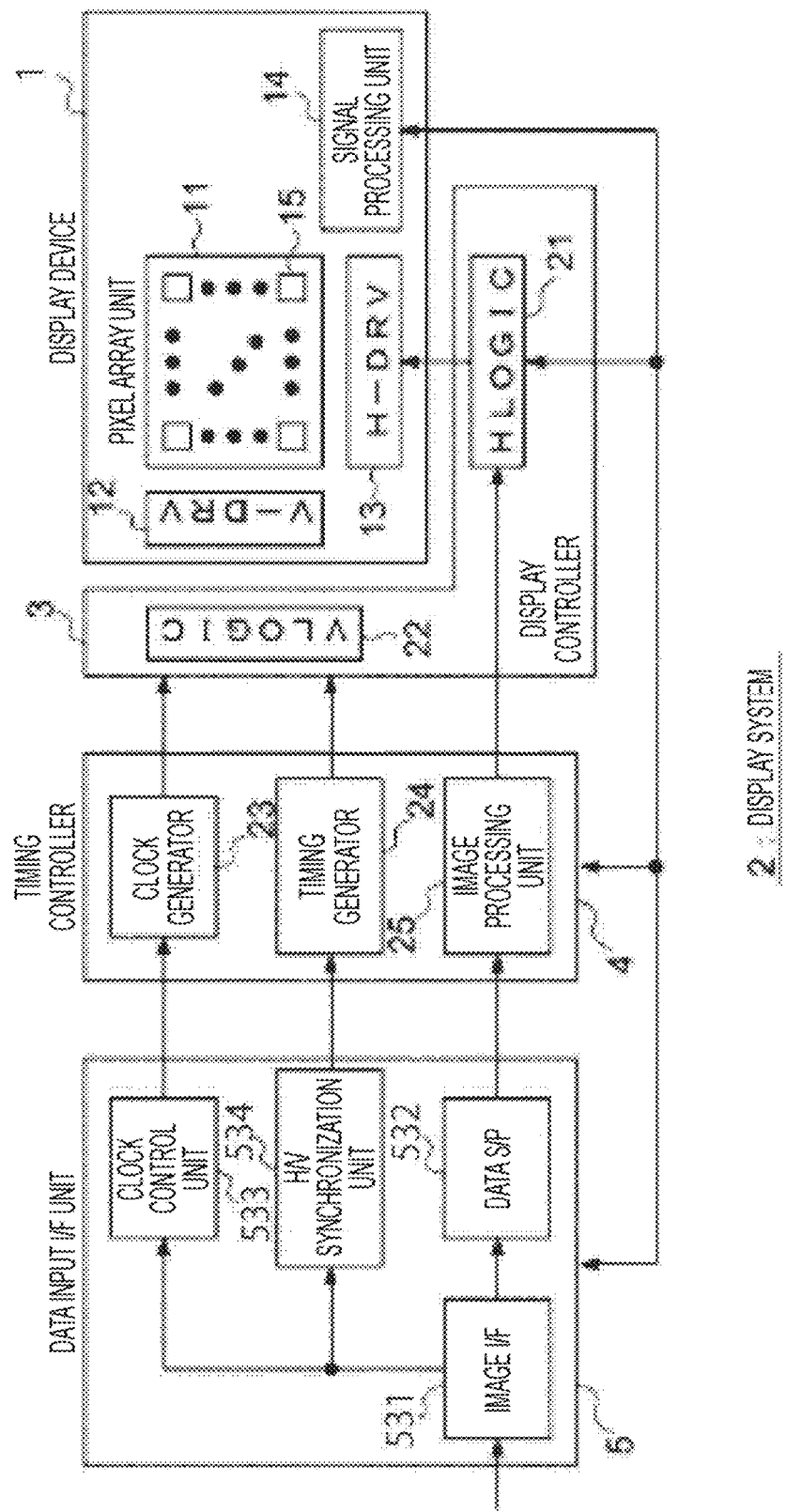
FIG. 1 is a block diagram illustrating a schematic configuration of a display system 2 including a display device 1 according to a first embodiment.

FIG. 1 is a block diagram illustrating a schematic configuration of a display system 2 including a display device 1 according to a first embodiment. The display system 2 of FIG. 1 illustrates a configuration of a micro organic light emitting diode (OLED) system. Note that the display device 1 according to the present embodiment is also applicable to the display system 2 including a display device 1 having a large screen, such as a TV or a PC monitor.

The display system 2 in FIG. 1 includes the display device 1, a display controller 3, a timing controller 4, and a data input/output I/F unit 5. Note that, although the display controller 3 and the like are separated from the display device 1 in FIG. 1, a display controller or the like may be integrated into the display device 1.

The display device 1 includes a pixel array unit 11, a vertical drive unit (V-DRV unit) 12, a horizontal drive unit (H-DRV unit) 13, and a signal processing unit 14.

Figure 2:
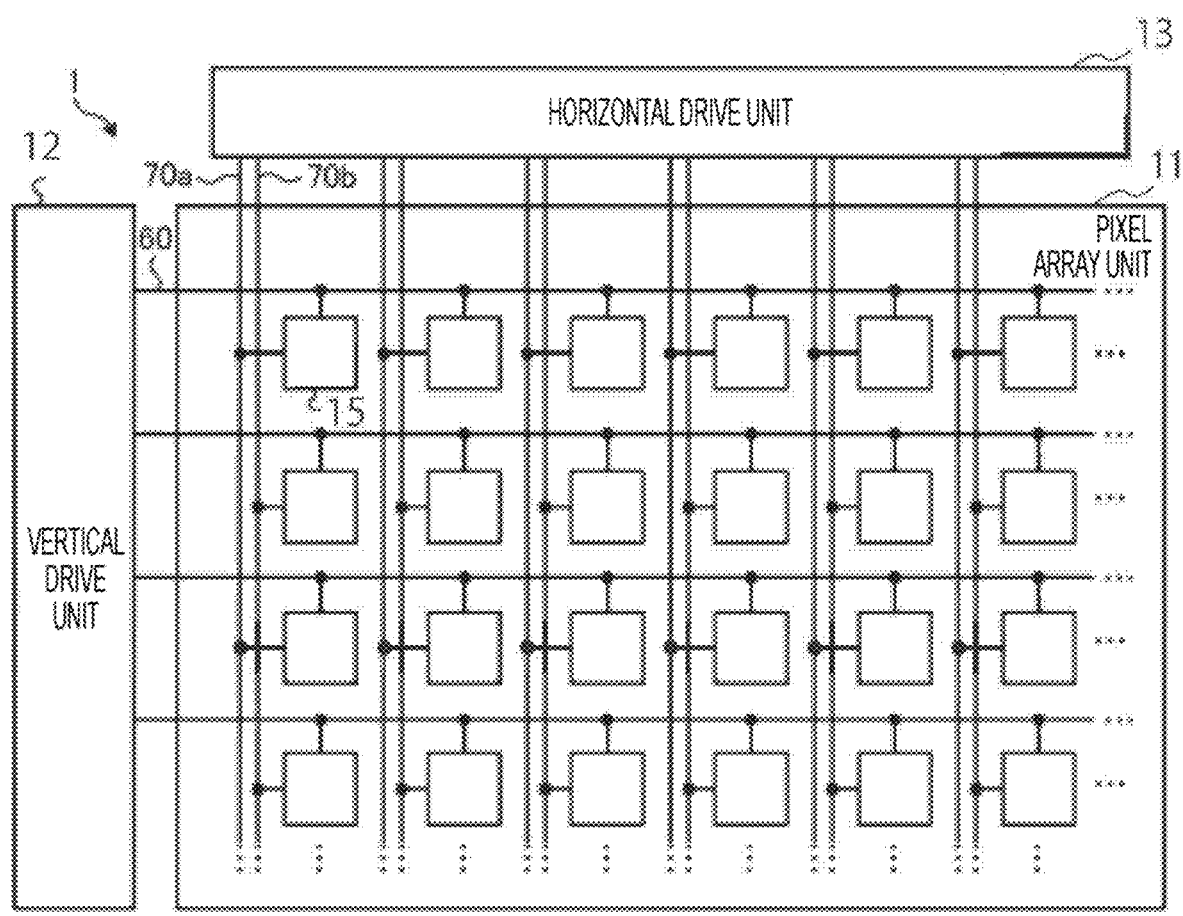
FIG. 2 is a diagram illustrating an example of wiring of signal lines and data lines of a pixel circuit.

FIG. 2 is a diagram illustrating an example of wiring of signal lines 60 and data lines 70 (70a and 70b) of each pixel circuit 15 of the pixel array unit 11. The pixel array unit 11 has a plurality of pixel circuits 15 arranged in a horizontal direction and a vertical direction. For example, a data line 70a is connected to each pixel circuit 15 in the odd-numbered row, and a data line 70b is connected to each pixel circuit 15 in the even-numbered row. As a result, each pixel circuit 15 in the odd-numbered row and each pixel circuit 15 in the even-numbered row can be independently controlled in parallel.

Each pixel circuit 15 includes, for example, a light emitting unit such as an organic EL element and a drive circuit for driving the light emitting unit, and the drive circuit includes a drive transistor and a capacitance unit. A current corresponding to the voltage held in the capacitance unit flows to the light emitting unit via the drive transistor. In the capacitance unit, a voltage corresponding to the degree of slope of the ramp waveform is held in the capacitance unit. An internal configuration of the pixel circuit 15 will be described later.

The signal processing unit 14 performs signal processing of a video signal to be displayed on the pixel array unit 11. The specific content of the signal processing is not limited, and is, for example, gamma correction or the like. The video signal subjected to the signal processing by the signal processing unit 14 is sent to the horizontal drive unit 13.

Figure 3:
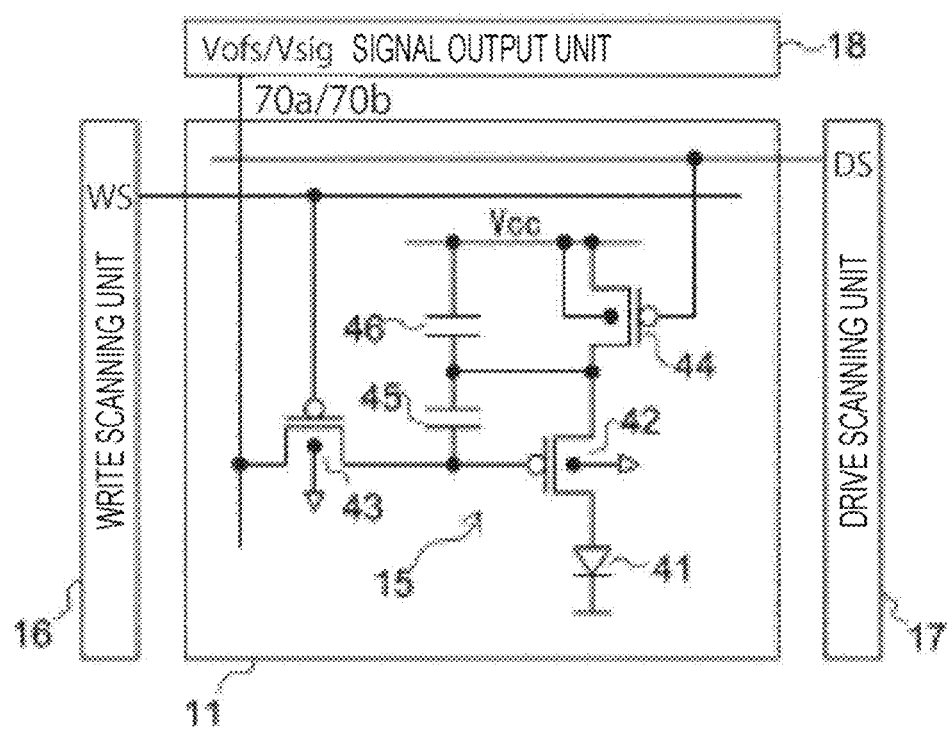
FIG. 3 is a circuit diagram illustrating an internal configuration of a pixel circuit.

As illustrated in FIG. 3 to be described later, the vertical drive unit 12 includes a write scanning unit 16 and a drive scanning unit 17. When writing a signal voltage to each of the pixel circuits 15, the write scanning unit 16 sequentially supplies a write scanning signal to each scanning line to sequentially drive each of scanning lines WS1 to WSn. The drive scanning unit 17 supplies a light emission control signal to each drive line in synchronization with the line-sequential scanning by the write scanning unit 16, and controls light emission and non-light emission of the light emitting unit.

The horizontal drive unit 13 includes a signal output unit 18 as illustrated in FIG. 3. The signal output unit 18 holds a ramp wave voltage at a timing corresponding to gradation of each pixel to generate a signal voltage. The signal output unit 18 selectively selects the signal voltage (voltage for setting the image signal) or the offset voltage (voltage for initialization) Vofs and supplies the signal voltage or the offset voltage to the corresponding data lines 70a and 70b.

The signal voltage or the offset voltage Vofs alternatively output from the signal output unit 18 is set in each pixel circuit 15 in units of rows selected by scanning by the write scanning unit 16 via the data lines 70a and 70b. In the present embodiment, for example, in a case where the signal voltage is supplied to each pixel circuit 15 in the odd-numbered row, the offset voltage Vofs is supplied to each pixel circuit 15 in the even-numbered row in parallel. Conversely, for example, in a case where the offset voltage Vofs is supplied to each pixel circuit 15 in the odd-numbered row, the signal voltage is supplied to each pixel circuit 15 in the even-numbered row in parallel. As a result, for example, a double display speed as compared with a case where there is one data line 70 can be realized.

As illustrated in FIG. 1 again, the display controller 3 includes an HLOGIC unit 21 and a VLOGIC unit 22, and performs display control on the pixel array unit 11.

The HLOGIC unit 21 supplies the video signal to the horizontal drive unit 13. The VLOGIC unit 22 supplies signals that define the timings of the scanning lines and the drive lines to the vertical drive unit 12.

The timing controller 4 includes a clock generator 23, a timing generator 24, and an image processing unit 25. The clock generator 23 generates a vertical synchronization clock and a horizontal synchronization clock of the display device 1, and supplies a vertical synchronization clock and a horizontal synchronization clock to the display controller 3. The timing generator 24 generates a signal that defines an operation timing of the display controller 3 and supplies the signal to the display controller 3. The image processing unit 25 performs various kinds of image processing on the video signal input to the data input/output I/F unit 5. The video signal subjected to the image processing is supplied to the HLOGIC unit 21 in the display controller 3.

The data input/output I/F unit 5 includes an image I/F unit 531, a data S/P unit 532, a clock control unit 533, and an H/V synchronization unit 534. The image I/F unit 531 receives a video signal from an outside. The video signal is serial digital data. The data S/P unit 532 converts the video signal into parallel data, and then transmits the parallel data to the image processing unit 25 in the timing controller 4. The clock control unit 533 generates a clock that suits display frequency of the display device 1. The H/V synchronization unit 534 generates a signal that defines the horizontal synchronization timing and vertical synchronization timing of the display device 1, and transmits the signal to the timing generator 24.

FIG. 3 is a circuit diagram illustrating an internal configuration of the pixel circuits 15. The pixel circuit 15 in FIG. 3 includes a light emitting unit 41 having an organic EL element, a drive transistor 42, a sampling transistor 43, a light emission control transistor 44, a holding capacitance 45, and an auxiliary capacitance 46. The pixel circuit 15 is formed on a semiconductor substrate such as silicon, and the drive transistor 42, the sampling transistor 43, and the light emission control transistor 44 are, for example, PMOS transistors. A power supply voltage is applied to a back gate of each of the transistors.

The sampling transistor 43 samples the signal voltage Vsig supplied from the signal output unit 18 via the data lines 70a and 70b, and writes the signal voltage Vsig into the holding capacitance 45. The light emission control transistor 44 is connected between a power supply node of a power supply voltage Vcc and a source electrode of the drive transistor 42, and controls light emission/non-light emission of the light emitting unit 41 under driving by the light emission control signal DS.

The holding capacitance 45 is connected between a gate electrode and a source electrode of the drive transistor 42. The holding capacitance 45 holds the signal voltage Vsig written by sampling by the sampling transistor 43. The drive transistor 42 drives the light emitting unit 41 by passing a drive current corresponding to holding voltage of the holding capacitance 45 through the light emitting unit 41. The auxiliary capacitance 46 is connected between the source electrode of the drive transistor 42 and a node at a fixed potential, for example, the power supply node of the power supply voltage Vcc. The auxiliary capacitance 46 reduces fluctuation in source potential of the drive transistor 42 when the signal voltage Vsig is written, and performs an action of matching a gate-source voltage Vgs of the drive transistor 42 with a threshold voltage Vth of the drive transistor 42.

Figure 4:
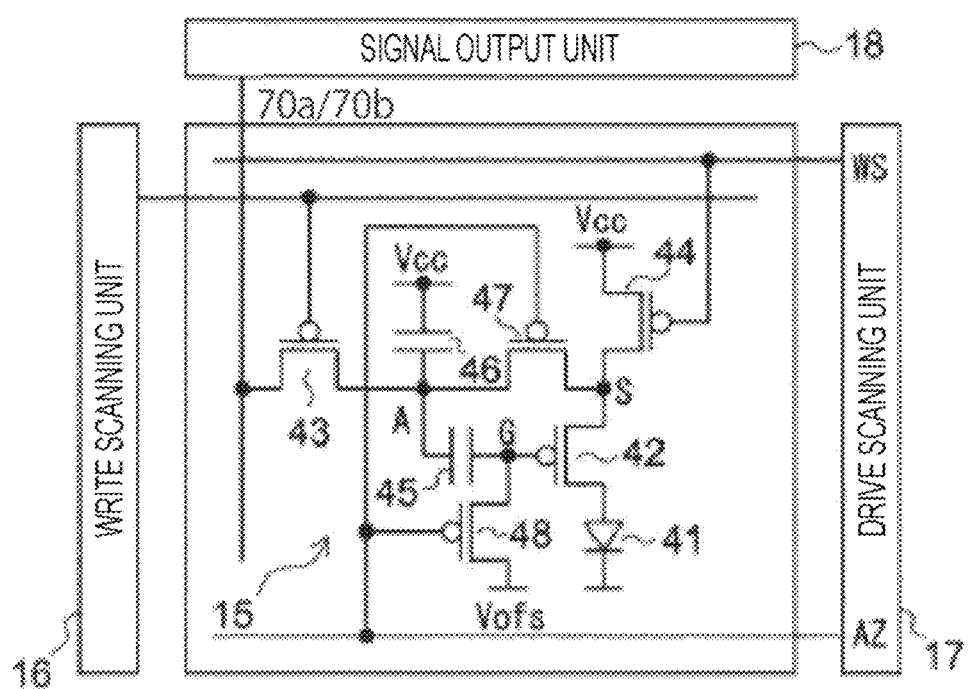
FIG. 4 is a circuit diagram of a pixel circuit having an internal configuration different from that of FIG. 3.

The internal configuration of the pixel circuit 15 is not limited to that illustrated in FIG. 3. For example, FIG. 4 is a circuit diagram of a pixel circuit 15 having an internal configuration different from that of FIG. 3. The light emission control transistor 44 is connected between the power supply potential Vcc and the source S of the drive transistor 42, and controls on/off of the light emitting unit 41. A gate of the light emission control transistor 44 is connected to a scanning line DS.

The sampling transistor 43 is connected between the data lines 70a and 70b and the connection node A of the holding capacitance 45 and the auxiliary capacitance 46. A gate of the sampling transistor 43 is connected to a scanning line WS. A detection transistor 47 is connected between the connection node A and the source S of the drive transistor 42. A gate of the detection transistor 47 is connected to a scanning line AZ. A switching transistor 48 is connected between a gate G of the drive transistor 42 and a predetermined offset potential Vofs. A gate of the switching transistor 48 is connected to the scanning line AZ. The detection transistor 47 and the switching transistor 48 constitute a correction means for Vth cancellation. The holding capacitance 45 is connected between the connection node A and the gate G of the drive transistor 42, and the auxiliary capacitance 46 is connected between the power supply potential Vcc and the connection node A.

The drive transistor 42 drives the light emitting unit 41 by passing a drain current Ids between a source and a drain according to a gate voltage Vgs applied between the source and the gate. The gate voltage Vgs of the drive transistor 42 is set according to a video signal Vsig supplied from the signal line SL, and light emission luminance of the light emitting unit 41 can be controlled according to a gradation of the video signal by the drain current Ids of the drive transistor 42.

The threshold voltage Vth of the drive transistor 42 fluctuates for each pixel. In order to cancel the threshold voltage, the threshold voltage Vth of the drive transistor 42 is detected in advance and held in the holding capacitance 45. Thereafter, the sampling transistor 43 is turned on, and a signal potential Vsig is written to the auxiliary capacitance 46. With this arrangement, a gate potential Vgs in which a variation in the threshold voltage Vth of the drive transistor 42 is corrected is generated.

FIGS. 3 and 4 are examples of the pixel circuit 15, and as will be described later, a pixel circuit 15 having an internal configuration other than FIGS. 3 and 4 can also be applied to the pixel circuit 15 according to the present embodiment.

Figure 5:
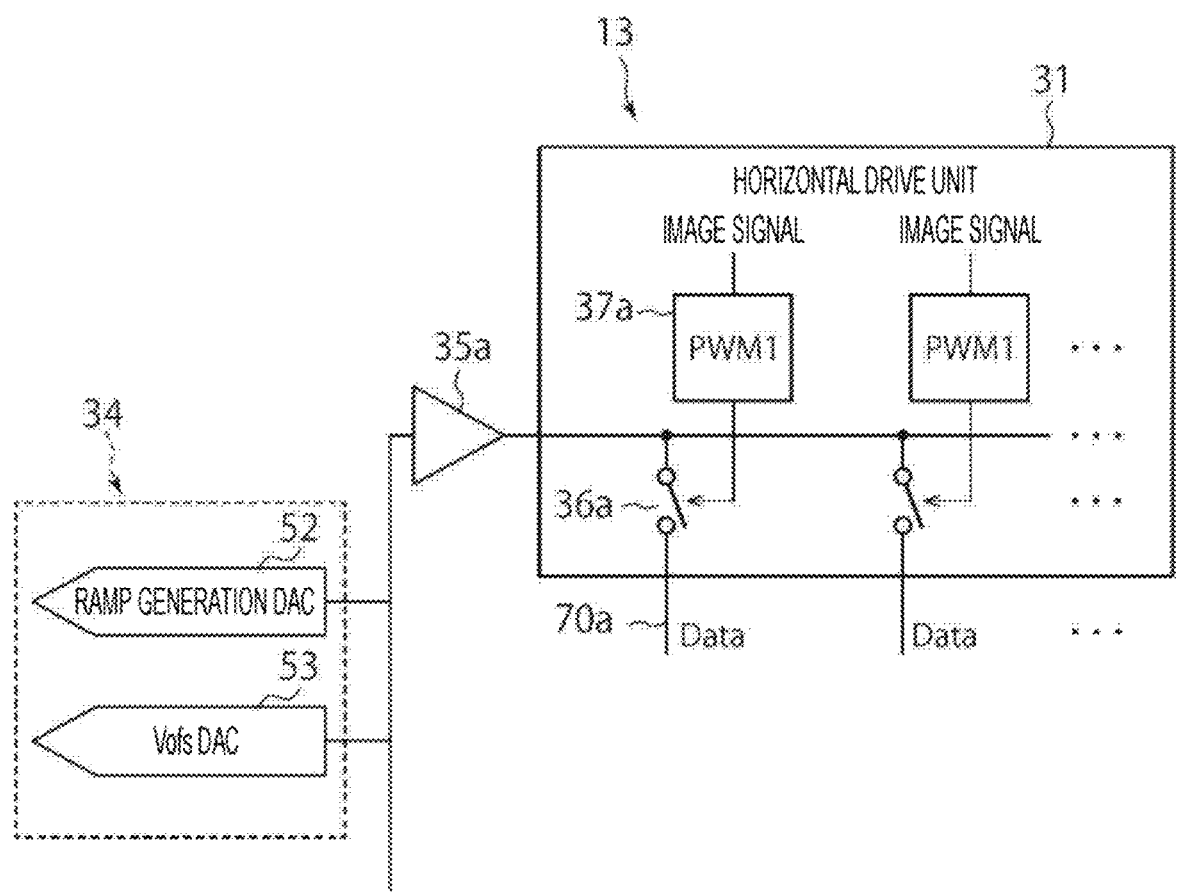
FIG. 5 is a block diagram illustrating an internal configuration of one horizontal drive unit on a data line a side.
Figure 6:
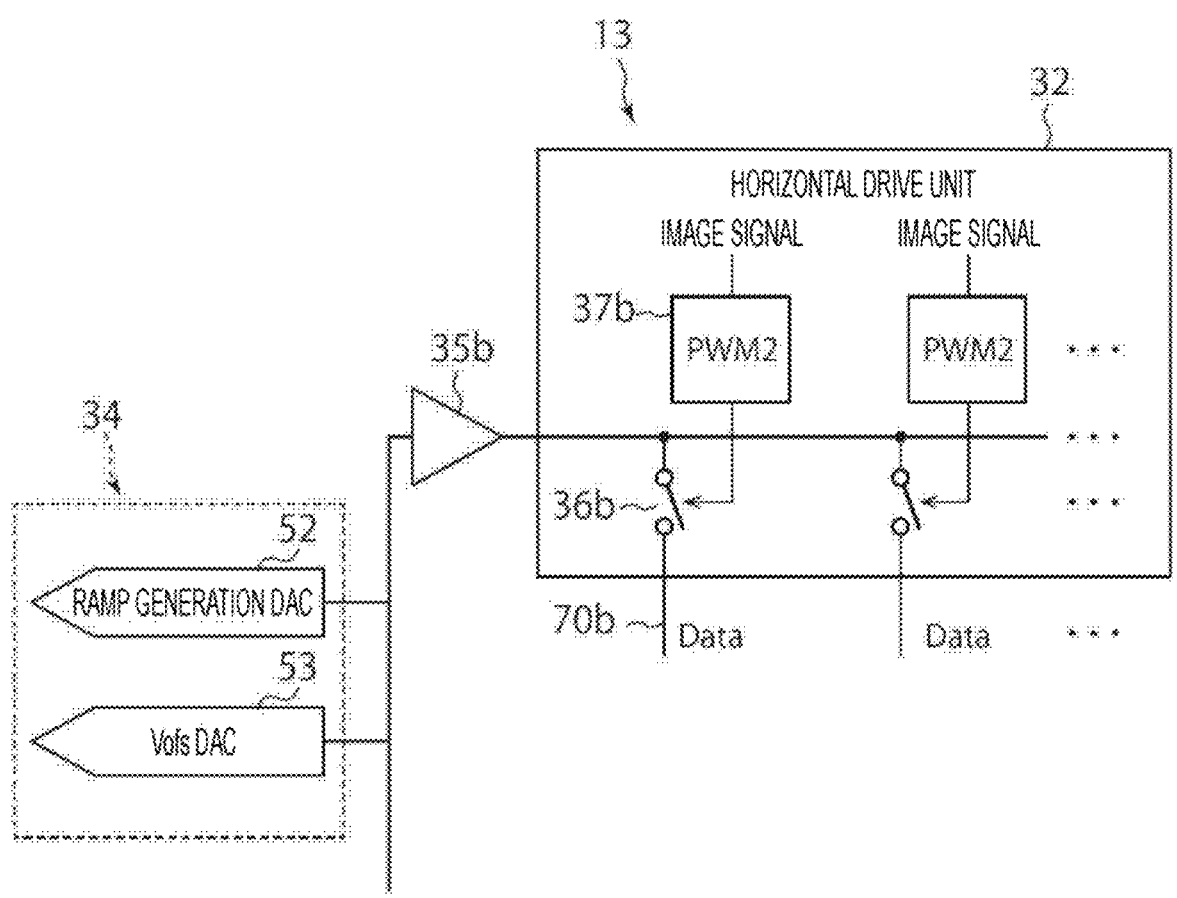
FIG. 6 is a block diagram illustrating an internal configuration of the other horizontal drive unit on a data line side.

FIG. 5 is a block diagram illustrating an internal configuration of the horizontal drive unit 13 on the data line 70a side. FIG. 6 is a block diagram illustrating an internal configuration of the horizontal drive unit 13 on the data line 70b side. As illustrated in FIGS. 5 and 6, the horizontal drive unit 13 includes a plurality of horizontal drive units 31 and 32, a ramp signal generation circuit 34, a selector 34a, and a plurality of ramp buffers 35a and 35b. The horizontal drive unit 31 and the ramp buffer 35a are connected to the data line 70a, and the horizontal drive unit 32 and the ramp buffer 35b are connected to the data line 70b.

The ramp signal generation circuit 34 is a circuit that generates a ramp signal. The ramp signal generation circuit 34 includes a signal ramp generation DAC 52 and a Vofs ramp generation DAC 53. The signal ramp generation DAC 52 outputs a ramp wave voltage whose voltage level continuously changes. The Vofs ramp generation DAC 53 outputs a Vofs ramp wave voltage for performing threshold correction and mobility correction of the drive transistor 42. The selector 34a selects one of the outputs of the signal ramp generation DAC 52 and the Vofs ramp generation DAC 53. The Vofs ramp generation DAC 53 according to the present embodiment outputs a ramp wave voltage whose voltage level continuously changes.

Figure 7:
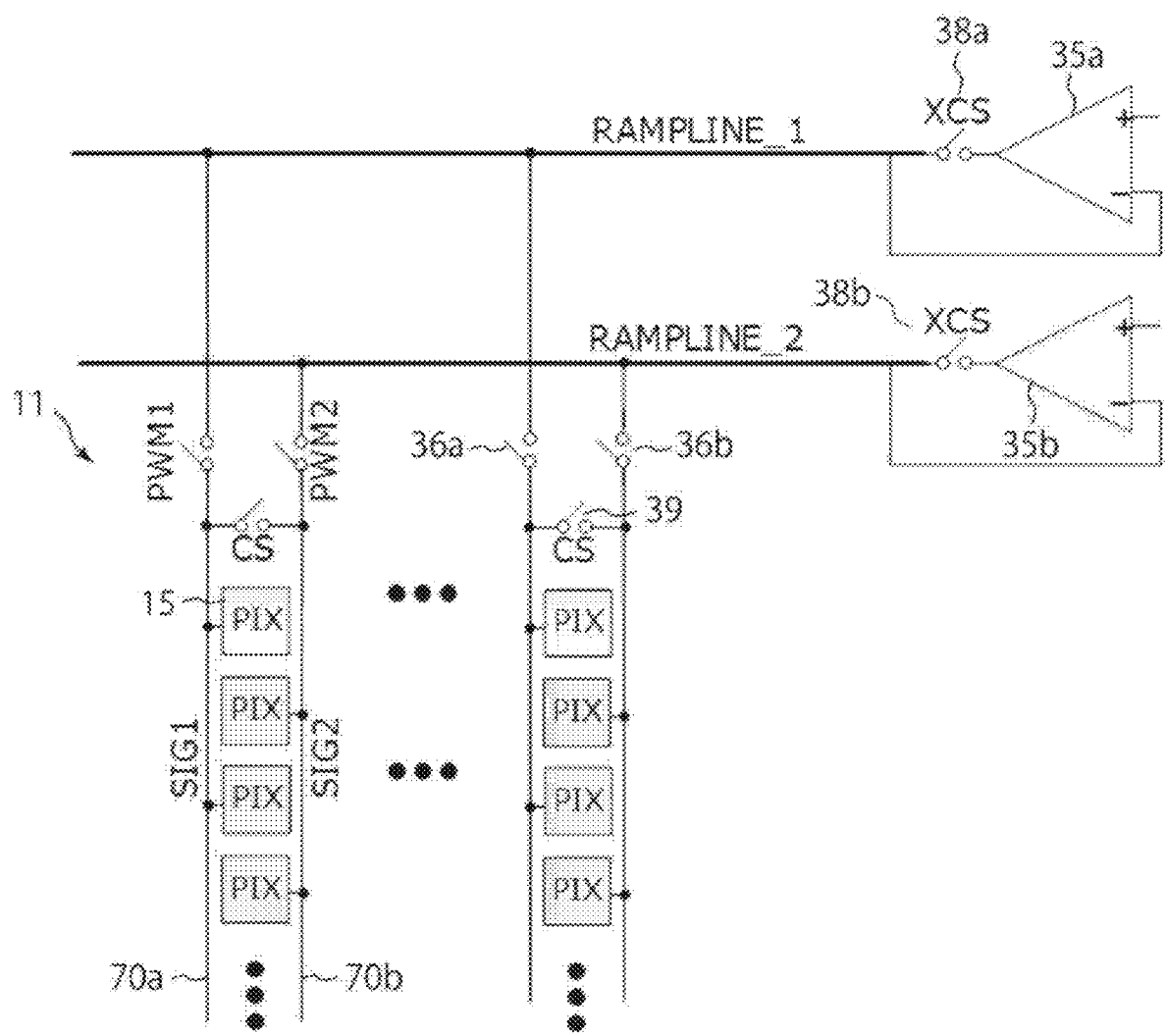
FIG. 7 is a diagram illustrating a more detailed connection example between a ramp buffer and a data line.

The ramp buffers 35a and 35b correspond to buffer amplifiers, and output the input ramp signals to the horizontal drive units 31 and 32, respectively. That is, the ramp buffers 35a and 35b switch between a Vofs ramp wave voltage for performing threshold correction and mobility correction of the drive transistor 42 in the pixel circuit 15 and a ramp wave voltage whose voltage level continuously changes, and output the switched voltage to the horizontal drive units 31 and 32. Further, as illustrated in FIG. 7, the ramp buffers 35a and 35b have changeover switches 38a and 38b therein. The switches 38a and 38b are switches capable of achieving high impedance.

The horizontal drive unit 31 includes a switch element 36a and a PWM 37a for each column. The horizontal drive unit 32 includes a switch element 36b and a PWM 37b for each column.

In a case of outputting the ramp wave voltage generated by the signal ramp generation DAC 52, each of the PWMs 37a and 37b generates a pulse width modulation (PWM) signal from a digital image signal. The PWM signal is a pulse signal of a constant period, and is a signal having a pulse width corresponding to a digital image signal. That is, the PWM signal is a pulse signal having a duty corresponding to the digital image signal.

Each of the PWMs 37a and 37b generates a pulse width modulation (PWM) signal having a predetermined width in a case of outputting the Vofs ramp wave voltage. The PWM signal is a pulse signal having a constant period and having a predetermined pulse width. That is, the Vofs PWM signal is a pulse signal having a predetermined width. As illustrated in FIG. 2, the horizontal drive units 31 and 32 can be applied to the horizontal drive unit 13 arranged in the upper portion of the pixel array unit 10.

FIG. 7 is a diagram illustrating a more detailed connection example between the ramp buffers 35a and 35b and the data lines 70a and 70b. The ramp buffers 35a and 35b have changeover switches 38a and 38b, respectively. The switches 38a and 38b can have high impedance.

In addition, a switch 39 for charge sharing is connected between the adjacent data lines 70a and 70b. The switch 39 is, for example, a transistor, and brings the data lines 70a and 70b into a conductive state or a non-conductive state.

Furthermore, in FIG. 7, RAMPLINE_1 indicates wiring to which the ramp voltage output from the ramp buffer 35a is supplied, and RAMPLINE_2 indicates wiring to which the ramp voltage output from the ramp buffer 35b is supplied. Further, PWM1 indicates a PWM signal output from the PWM 37a, and PWM2 indicates a PWM signal output from the PWM 37b. The PWM1 signal and the PWM2 signal bring the switches 36a and 36b into a conductive state at a high level and bring the switches into a non-conductive state at a low level.

In addition, CS represents a switching signal of the switch 39. The CS signal brings the switch 39 into a conductive state at a high level and brings the switch into a non-conductive state at a low level.

Figure 8:
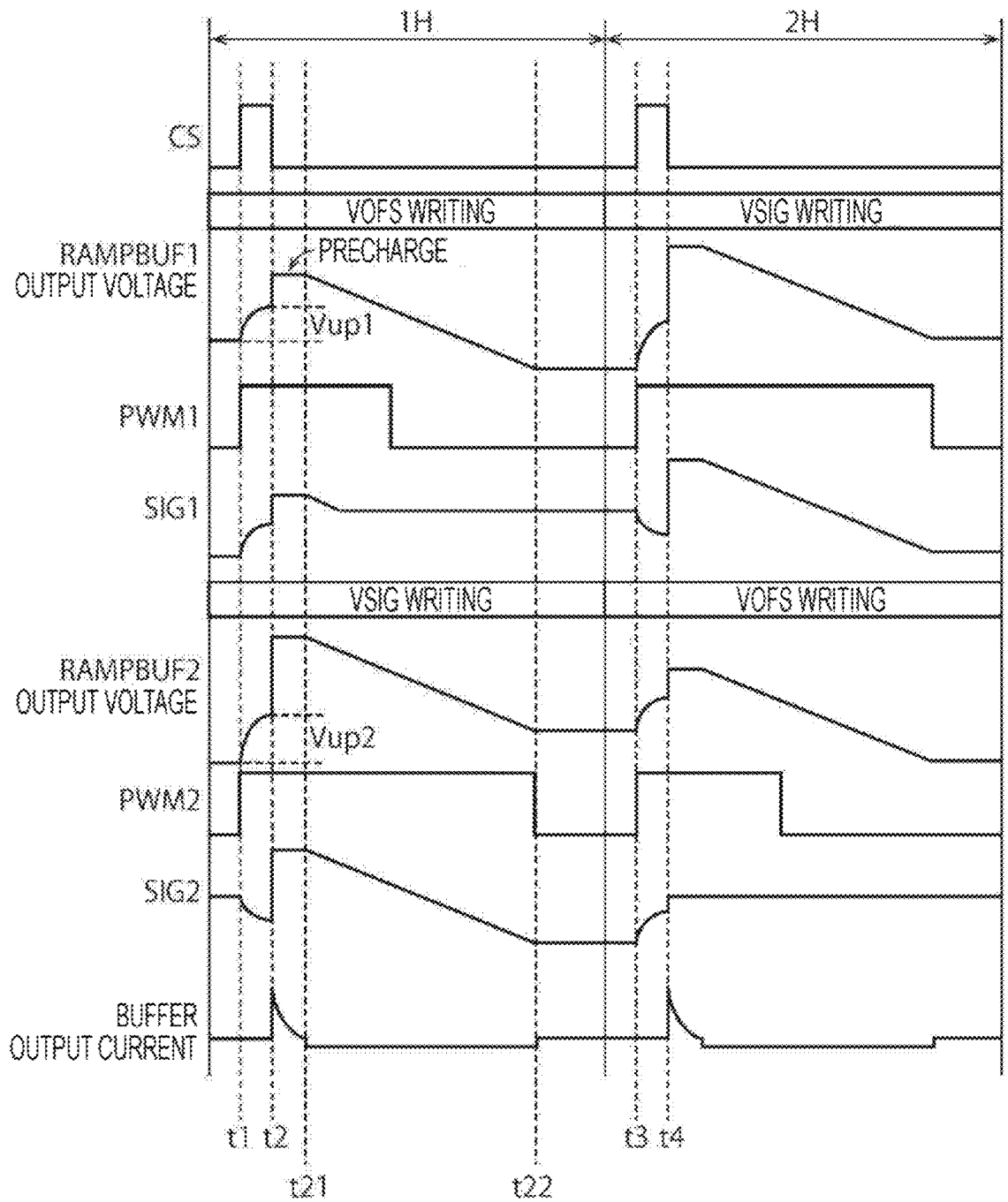
FIG. 8 is a time chart illustrating an operation example of a display device.

FIG. 8 is a time chart illustrating an operation example of the display device 1. From the top, the CS signal, the RAMPBUF1 output voltage which is the voltage output to RAMPLINE_1, the PWM1 signal, the SIG1 signal indicating the voltage of the data line 70a, the PAMPBUF2 output voltage which is the voltage output to RAMPLINE_2, and the PWM2 signal, and the SIG2 signal indicating the voltage of the data line 70b are illustrated. The buffer output current indicates a current to be output to RAMPLINE_2.

As illustrated in FIG. 8, in the first horizontal period 1H, the data line 70a side is a Vofs voltage setting period, and the data line 70b side is a signal voltage setting period. The RAMPBUF1 output voltage and the RAMPBUF2 output voltage have a precharge period that is a constant voltage period at the start of output.

At timing t1 of the first horizontal period 1H, the CS signal becomes a high level, and the switch 39 is brought into a conductive state. In addition, at timing t1, the switches 38a and 38b are in a high-impedance state. At this time, in the pixel circuit 15 (see FIG. 3), the transistor 43 goes into a conductive state, and the transistors 42 and 44 go into a non-conductive state. That is, by bringing the switch 39 into a conductive state, the accumulated charges of the capacitances 45 and 46 of each pixel circuit 15 are shared. At this time, since the switches 36a and 36b are also in the conductive state, the potentials of RAMPLINE_1 and RAMPLINE_2 also become the same potential. Accordingly, at timing t2, the states of the potentials of RAMPLINE_1 and RAMPLINE_2 change toward the higher potential side as Vup1 and Vup2, respectively. In addition, when RAMPLINE_1 and RAMPLINE_2 have the same potential, potential fluctuation due to parasitic capacitances of RAMPLINE_1 and RAMPLINE_2 is also suppressed.

Then, at timing t2, the CS signal becomes a high level, and the switch 39 is brought into a non-conductive state. In addition, at timing t2, the switches 38a and 38b are in a low impedance state. On the other hand, each pixel 15 also starts a normal driving operation.

Such processing is also performed in the horizontal period H2. That is, the CS signal goes to a high level at timing t3 of the second horizontal period 2H, and the switch 39 is brought into a conductive state. In addition, at timing t3, the switches 38a and 38b are in a high-impedance state. At this time, in the pixel circuit 15 (see FIG. 3), the transistor 43 goes into a conductive state, and the transistors 42 and 44 go into a non-conductive state. That is, by bringing the switch 39 into a conductive state, the accumulated charges of the capacitances 45 and 46 of each pixel circuit 15 are shared. At this time, since the switches 36a and 36b are also in the conductive state, the potentials of RAMPLINE_1 and RAMPLINE_2 also become the same potential. Accordingly, at timing t4, the states of the potentials of RAMPLINE_1 and RAMPLINE_2 change toward the higher potential side as Vup1 and Vup2, respectively. Driving equivalent to the horizontal periods H1 and H2 is repeated.

As described above, at the timings t2 and t4, the states of the potentials of RAMPLINE_1 and RAMPLINE_2 change toward the higher potential side as Vup1 and Vup2, respectively. In addition, it is also possible to suppress an excessive current of the buffer output current flowing at the timings t2 and t4. As can be seen from these, the power supply capacitance of the ramp signal generation circuit 34 can be reduced, and the current consumption of the pixel array unit 11 can be suppressed. Note that, in FIG. 8, the precharge ends at timing t21. In addition, the timing of performing the charge sharing may be a period from the completion of the ramp voltage writing to the start of the precharge. That is, the period from the completion of the ramp voltage writing to the start of the precharge is a period from t22 to t4 in which the PWM2 becomes Low.

Comparative Examples

Figure 9:
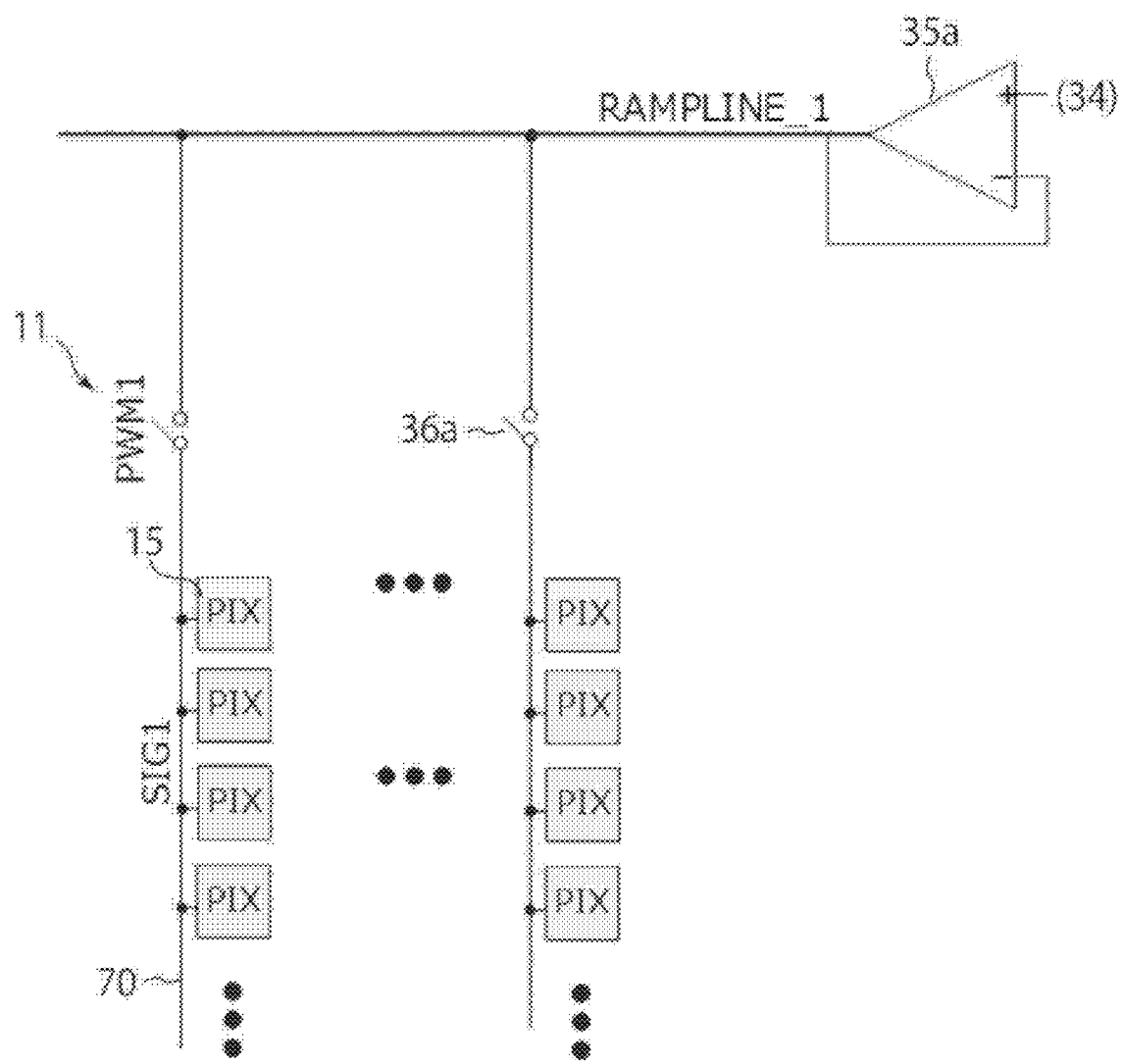
FIG. 9 is a diagram illustrating a more detailed connection example between a ramp buffer and a data line according to a comparative example.

FIG. 9 is a diagram illustrating a more detailed connection example between the ramp buffer 35a and the data line 70 according to the comparative example. The display device 1 according to the comparative example includes only the ramp buffer 35 and does not include the switch 39 for charge sharing. In FIG. 7, RAMPLINE_1 indicates wiring to which the ramp voltage output from the ramp buffer 35a is supplied. Further, PWM1 indicates a PWM signal output from the PWM 37a.

Figure 10:
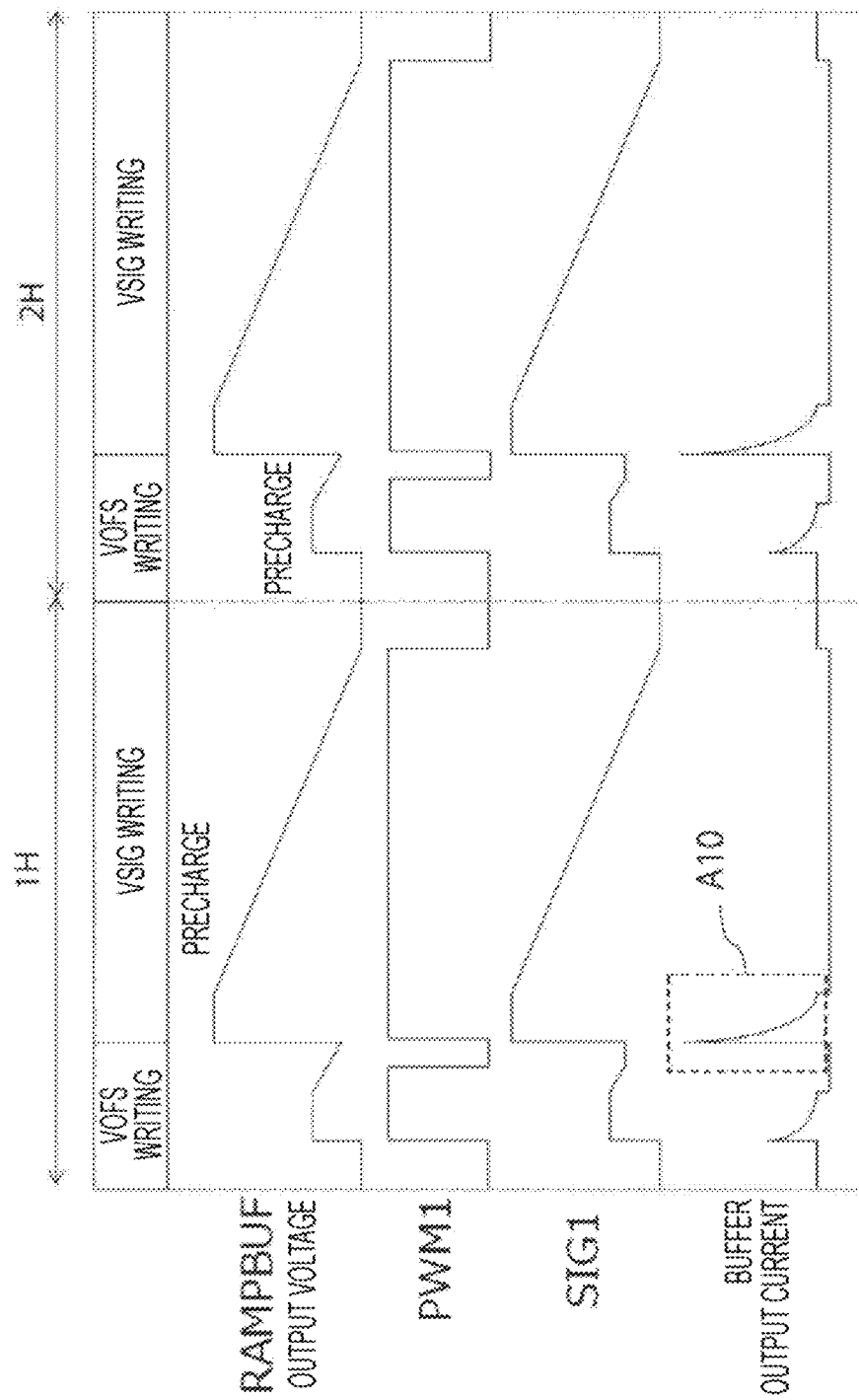
FIG. 10 is a time chart illustrating an operation example of a display device according to the comparative example.

FIG. 10 is a time chart illustrating an operation example of the display device 1 according to the comparative example. A CS signal, a RAMPBUF output voltage which is a voltage output to RAMPLINE_1, a PWM1 signal, and a SIG1 signal indicating a voltage of the data line 70 are illustrated from the top. The buffer output current indicates a current to be output to RAMPLINE_1.

As illustrated in FIG. 10, there is no period for charge sharing in the setting period of the Vofs voltage and the setting period of the signal voltage in the horizontal period. Therefore, the ramp voltage output from the ramp signal generation circuit 34 is always supplied with respect to the reference voltage. As a result, the buffer output current generated when the ramp voltage of the signal voltage is applied becomes excessive as illustrated in the area A10. On the other hand, in the display device 1 according to the present embodiment, as illustrated in FIG. 8, since the ramp voltage of the signal voltage is applied after the charge sharing, the buffer output current generated when the ramp voltage of the signal voltage is applied is suppressed.

As described above, in the display device 1 according to the present embodiment, the plurality of data lines 70a and 70b is brought into the conductive state before the ramp signal generation circuit 34 performs the precharge operation. As a result, the accumulated charges of the capacitances 45 and 46 of the pixel circuits 15 in the conductive state between the plurality of data lines 70a and 70b are shared, and the states of the potentials of RAMPLINE_1 and RAMPLINE_2 change to the higher potential side as Vup1 and Vup2, respectively. As a result, the power supply capacitance of the ramp signal generation circuit 34 can be reduced, and the current consumption of the pixel array unit 11 can be suppressed.

Modification 1 of First Embodiment

In the display device 1 according to the first embodiment, the Vofs ramp generation DAC 53 of the ramp signal generation circuit 34 outputs a ramp wave, but is different from the display device 1 according to the first embodiment in that the Vofs voltage according to Modification 1 of the first embodiment is set to a DC voltage. Hereinafter, differences from the display device 1 according to the first embodiment will be described.

Figure 11:
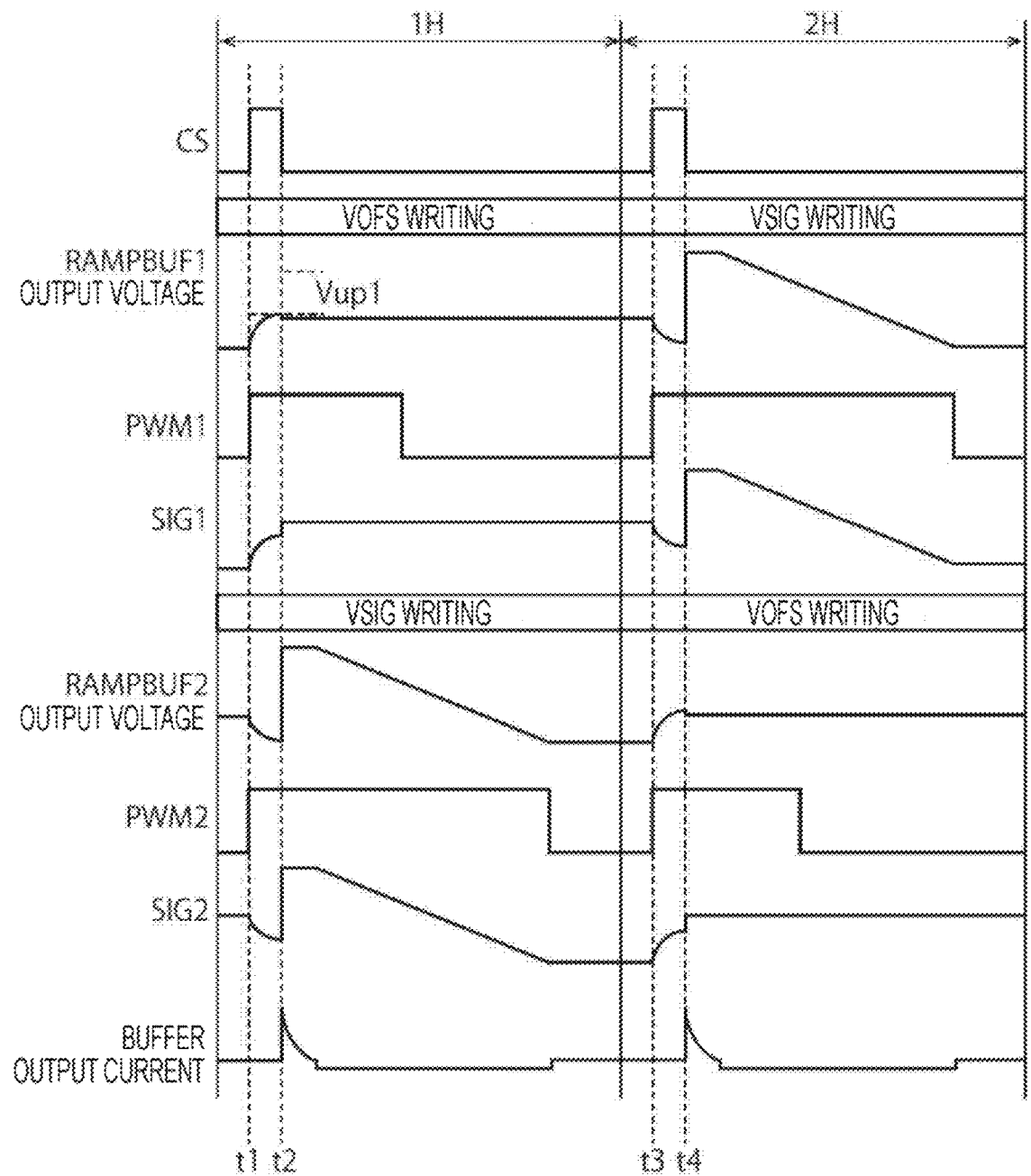
FIG. 11 is a time chart illustrating an operation example of a display device 1 according to Modification 1 of the first embodiment.

FIG. 11 is a time chart illustrating an operation example of the display device 1 according to Modification 1 of the first embodiment. From the top, the CS signal, the RAMPBUF1 output voltage which is the voltage output to RAMPLINE_1, the PWM1 signal, the SIG1 signal indicating the voltage of the data line 70a, the RAMPBUF2 output voltage which is the voltage output to RAMPLINE_2, and the PWM2 signal, and the SIG2 signal indicating the voltage of the data line 70b are illustrated. The buffer output current indicates a current to be output to RAMPLINE_2. The display device 1 is different from the display device 1 according to the first embodiment in that the Vofs voltage is a DC fixed potential.

As described above, at the timings t2 and t4, the states of the potentials of RAMPLINE_1 and RAMPLINE_2 change to a higher potential side by Vup1 on the setting side of the Vofs voltage. Furthermore, since the accumulated charges of the capacitances 45 and 46 of the respective pixel circuits 15 of the respective pixels are shared, it is possible to suppress generation of the pixel circuit 15 with specifically reduced charges. Therefore, even on the setting side of the signal voltage at the timings t2 and t4, it is possible to suppress an excessive current of the buffer output current that occurs inrush to the pixel circuit 15 in which the charge is specifically reduced. As a result, the power supply capacitance of the ramp signal generation circuit 34 can be reduced, and the current consumption of the pixel array unit 11 can be suppressed.

Modification 2 of First Embodiment

The display device 1 according to the first embodiment is different from the display device 1 according to the first embodiment in that the plurality of data lines 70a and 70b is brought into the conductive state before the Vofs ramp generation DAC 53 of the ramp signal generation circuit 34 performs the precharge operation, whereas on the Vofs voltage setting side according to Modification 2 of the first embodiment, the plurality of data lines 70a and 70b is brought into the conductive state and the precharge operation is started. Hereinafter, differences from the display device 1 according to the first embodiment will be described.

Figure 12:
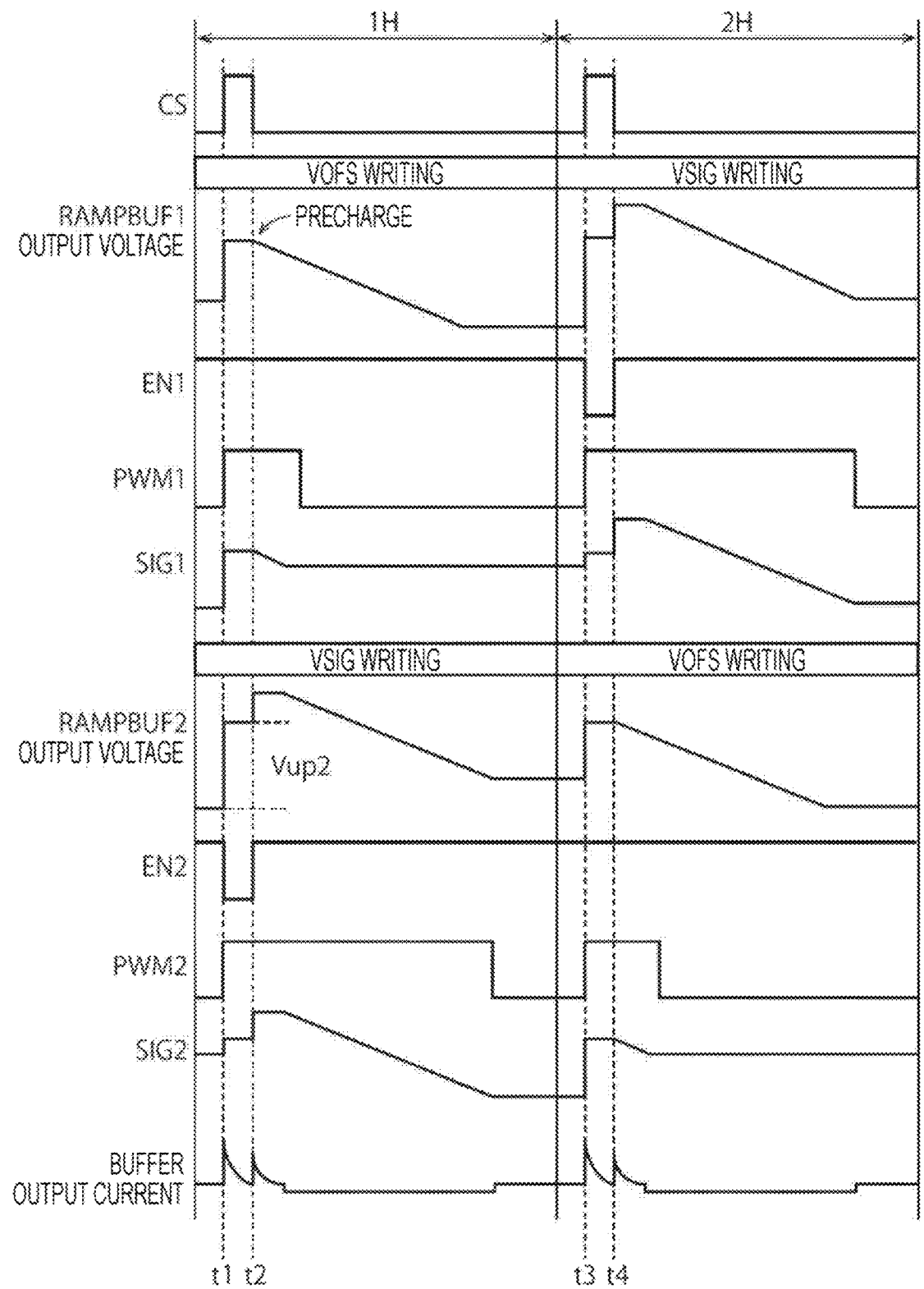
FIG. 12 is a time chart illustrating an operation example of a display device 1 according to Modification 2 of the first embodiment.

FIG. 12 is a time chart illustrating an operation example of the display device 1 according to Modification 2 of the first embodiment. From the top, the CS signal, the RAMPBUF1 output voltage which is the voltage output to RAMPLINE_1, the PWM1 signal, the SIG1 signal indicating the voltage of the data line 70a, the RAMPBUF2 output voltage which is the voltage output to RAMPLINE_2, and the PWM2 signal, and the SIG2 signal indicating the voltage of the data line 70b are illustrated. The buffer output current indicates a current to be output to RAMPLINE_2. The Vofs voltage setting side is different from the display device 1 according to the first embodiment in that a plurality of data lines 70a and 70b is brought into a conductive state and a precharge operation is started.

In this case, during the period in which the CS signal is at the high level, the switches 38a and 38b are set to low impedance on the setting side of the Vofs voltage, and the switches 38a and 38b are set to high impedance on the setting side of the signal voltage.

As described above, since the plurality of data lines 70a and 70b is brought into the conductive state at the timings t1 and t3, the accumulated charges of the capacitances 45 and 46 of each pixel circuit 15 of each pixel are shared during the precharge operation period on the setting side of the Vofs voltage. As a result, it is possible to suppress generation of the pixel circuit 15 with specifically reduced charge. For this reason, it is also possible to suppress an excessive current of the buffer output current that occurs inrush to the pixel circuit 15 in which the charge is specifically reduced. As a result, the power supply capacitance of the ramp signal generation circuit 34 can be reduced, and the current consumption of the pixel array unit 11 can be suppressed.

On the other hand, also on the setting side of the signal voltage at the timings t2 and t4, since the potential is increased to the precharge voltage on the setting side of the Vofs voltage, the voltage can be supplied from a state where the potential of the precharge is increased by Vup2. As a result, the load of the signal ramp generation DAC 52 of the ramp signal generation circuit 34 can also be reduced.

Modification 3 of First Embodiment

The display device 1 according to the first embodiment is different from the display device 1 according to the first embodiment in that the plurality of data lines 70a and 70b is brought into the conductive state before the signal ramp generation DAC 52 of the ramp signal generation circuit 34 performs the precharge operation, whereas on the signal voltage setting side according to Modification 3 of the first embodiment, the plurality of data lines 70a and 70b is brought into the conductive state and the precharge operation is started. Hereinafter, differences from the display device 1 according to the first embodiment will be described.

Figure 13:
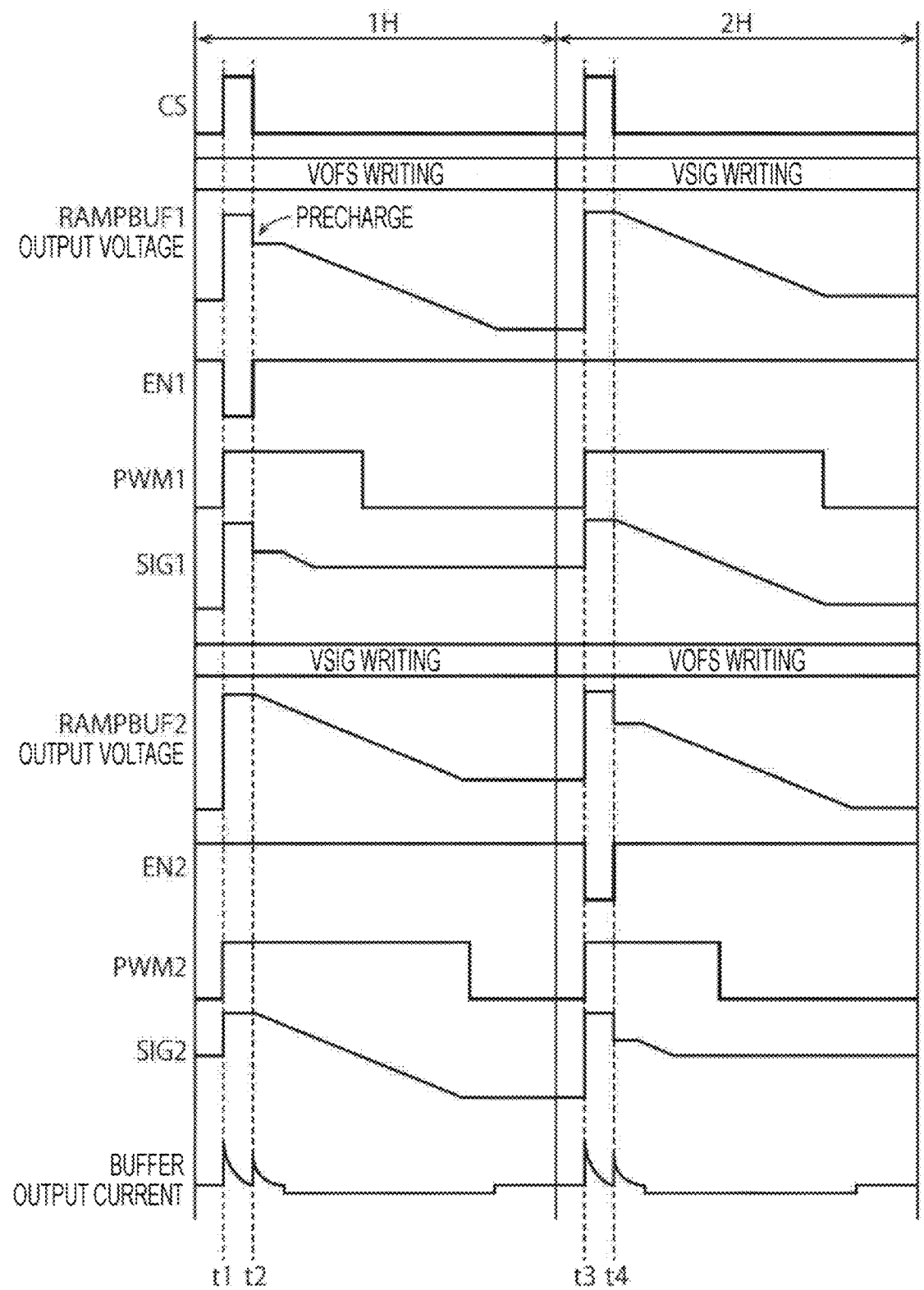
FIG. 13 is a time chart illustrating an operation example of a display device 1 according to Modification 3 of the first embodiment.

FIG. 13 is a time chart illustrating an operation example of the display device 1 according to Modification 3 of the first embodiment. From the top, the CS signal, the RAMPBUF1 output voltage which is the voltage output to RAMPLINE_1, the PWM1 signal, the SIG1 signal indicating the voltage of the data line 70a, the PAMPBUF2 output voltage which is the voltage output to RAMPLINE_2, and the PWM2 signal, and the SIG2 signal indicating the voltage of the data line 70b are illustrated. The buffer output current indicates a current to be output to RAMPLINE_2. The signal voltage setting side is different from the display device 1 according to the first embodiment in that the plurality of data lines 70a and 70b is brought into a conductive state and a precharge operation is started.

In this case, during the period in which the CS signal is at the high level, the switches 38a and 38b are set to low impedance on the signal voltage setting side, and the switches 38a and 38b are set to high impedance on the Vofs voltage setting side.

As described above, since the plurality of data lines 70a and 70b is brought into the conductive state at the timings t1 and t3, the accumulated charges of the capacitances 45 and 46 of the pixel circuits 15 of the respective pixels are shared during the precharge operation period on the signal voltage setting side, so that it is possible to suppress generation of the pixel circuit 15 with specifically reduced charges. For this reason, it is also possible to suppress an excessive current of the buffer output current that occurs inrush to the pixel circuit 15 in which the charge is specifically reduced. As a result, the power supply capacitance of the ramp signal generation circuit 34 can be reduced, and the current consumption of the pixel array unit 11 can be suppressed.

On the other hand, also on the setting side of the Vofs voltage at the timings t2 and t4, since the potential is increased to the precharge voltage on the setting side of the signal voltage, the Vofs voltage can be supplied by lowering the potential of the precharge. As a result, the load of the Vofs ramp generation DAC 530 of the ramp signal generation circuit 34 can also be reduced.

Modification 4 of First Embodiment

Figure 14:
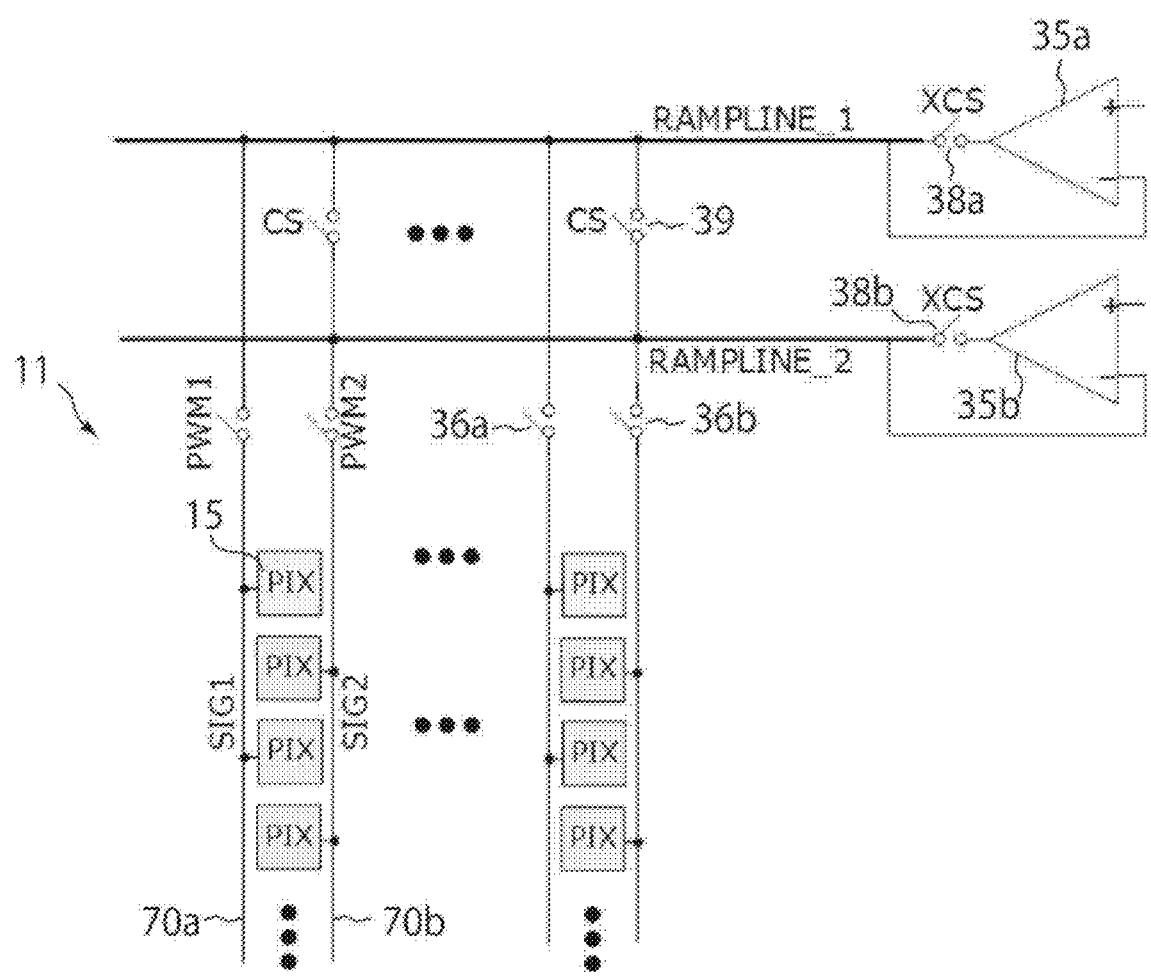
FIG. 14 is a diagram illustrating an example of connection between a ramp buffer and a data line according to Modification 4 of the first embodiment.

FIG. 14 is a diagram illustrating a more detailed connection example between the ramp buffers 35a and 35b and the data lines 70a and 70b according to Modification 4 of the first embodiment. In the display device 1 according to the first embodiment, the switch 39 for charge sharing is configured between the data lines 70a and 70b, whereas the switch 39 for charge sharing according to Modification 4 of the first embodiment is different in that it is configured between the ramp line, RAMPLINE_1, and RAMPLINE_2. As described above, in the case of configuring between the ramp line, RAMPLINE_1, and RAMPLINE_2, the installation space of the switch 39 on the pixel array unit 11 side becomes unnecessary, and the degree of freedom in wiring of the pixel circuit 15 is suppressed from being hindered.

Second Embodiment

In the display device 1 according to the first embodiment, the Vofs voltage is set in the pixel circuit 15, but the display device 1 according to the present embodiment is different from the display device 1 according to the first embodiment in that the Vofs voltage is not set in the pixel circuit 15. Hereinafter, differences from the display device 1 according to the first embodiment will be described.

Figure 15:
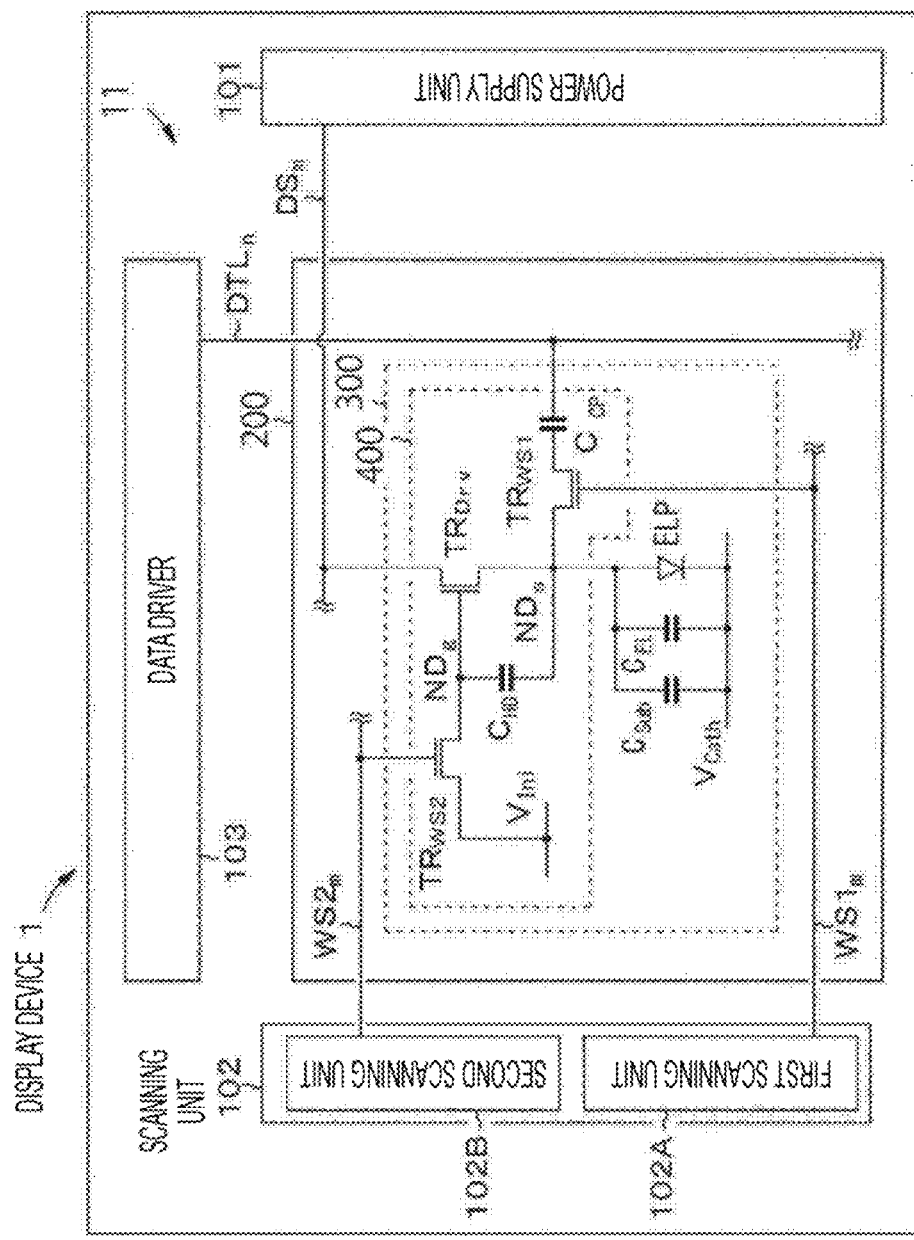
FIG. 15 is a configuration diagram of a display device according to a second embodiment.

FIG. 15 is a configuration diagram of the display device 1 according to the second embodiment. The display device 1 includes a pixel array unit 200 in which a pixel circuit 300 including a light emitting unit ELP and a drive circuit 400 that drives the light emitting unit ELP is arranged, and a drive unit 100 that drives the pixel array unit 200.

In the pixel array unit 200, the pixel circuits 300 are arranged in a two-dimensional matrix in a state of being connected to the first scanning line WS1, the second scanning line WS2, the feeder line DS, and the data line DTL. The first scanning line WS1, the second scanning line WS2, and the feeder line DS are provided to extend in the row direction, and the data line DTL is provided to extend in the column direction.

Note that, for convenience of illustration, FIG. 15 illustrates the connection relationship for one pixel circuit 300, more specifically, the (n, m)-th pixel circuit 300. The drive unit 100 includes a power supply unit 101, a scanning unit 102, and a data driver 103. The scanning unit 102 includes a first scanning unit 102A and a second scanning unit 102B. A driving voltage or the like is supplied from the power supply unit 101 to the feeder line DS. A signal is supplied from the first scanning unit 102A to the first scanning line WS1, and a signal is supplied from the second scanning unit 102B to the second scanning line WS2. The voltage of the ramp waveform is supplied from the data driver 103 to the data line DTL.

The drive circuit 400 included in the pixel circuit 300 includes at least a drive transistor TRDry and a capacitance unit CHD. In the drive transistor TRDrv, a voltage is supplied to one source/drain region, the other source/drain region is connected to the light emitting unit ELP, and a current corresponding to the voltage held in the capacitance unit CHD flows to the light emitting unit ELP via the drive transistor TRDrv. The light emitting unit ELP includes a current-driven electro-optical element whose light emission luminance changes according to a flowing current value, more specifically, an organic electroluminescence light emitting unit.

The drive unit 100 sets the voltage of the capacitance unit CHD so that the drive transistor TRDrv is in the non-conductive state, applies the voltage of the ramp waveform to the other source/drain region in a state where the gate electrode is electrically floating, and then applies a predetermined constant voltage to the gate electrode in a state where the application of the voltage of the ramp waveform is continued, thereby causing the capacitance unit CHD to hold a voltage corresponding to the degree of slope of the ramp waveform.

The drive transistor TRDrv includes an n-channel field effect transistor. In the drive transistor TRDry, one source/drain region is connected to the feeder line DS, and the other source/drain region is connected to one end of the light emitting unit ELP, more specifically, an anode electrode provided in the light emitting unit ELP. The capacitance unit CHD is connected between the gate electrode of the drive transistor TRDrv and the other source/drain region.

The capacitance unit CHD is used to hold a voltage (so-called gate-source voltage) of the gate electrode with respect to the source region of the drive transistor TRDrv. The "source region" in this case means a source/drain region on a side that acts as a "source region" when the light emitting unit ELP emits light. In the light emission state of the pixel circuit 300, one source/drain region (the side connected to the feeder line DS in FIG. 15) of the drive transistor TRDrv serves as a drain region, and the other source/drain region (one end of the light emitting unit ELP, specifically, the side connected to the anode electrode) serves as a source region.

The drive circuit 400 further includes a first switching element TRWS1. Similarly to the drive transistor TRDrv, the first switching element TRWS1 includes an n-channel field effect transistor. The gate electrode of the first switching element TRWS1 is connected to the first scanning line WS1, and conduction/non-conduction of the first switching element TRWS1 is controlled by a signal from the first scanning unit 102A.

In the first switching element TRWS1, a voltage of a ramp waveform is applied to one end (one source/drain region), and the other end (the other source/drain region) is connected to the other source/drain region of the drive transistor TRDry. Then, when the first switching element TRWS1 is brought into a conductive state, a voltage having a ramp waveform is applied to the other source/drain region of the drive transistor TRDrv.

In the example illustrated in FIG. 15, one end of the first switching element TRWS1 is connected to the data line DTL via the coupling capacitance CCP. Therefore, a voltage of a ramp waveform is applied to one end of the first switching element TRWS1 via the coupling capacitance CCP. Note that a configuration in which the position of the coupling capacitance CCP is switched, that is, a configuration in which the other end of the first switching element TRWS1 is connected to the other source/drain region of the drive transistor TRDry via the coupling capacitance CCP may be adopted.

The drive circuit 400 further includes a second switching element TRWS2. Similarly to the drive transistor TRDrv, the second switching element TRWS2 includes an n-channel field effect transistor. The gate electrode of the second switching element TRWS2 is connected to the second scanning line WS2, and conduction/non-conduction of the second switching element TRWS2 is controlled by a signal from the second scanning unit 102B.

In the second switching element TRWS2, a predetermined constant voltage VIni is applied to one end (one source/drain region), and the other end (the other source/drain region) is connected to the gate electrode of the drive transistor TRDrv. Then, when the second switching element TRWS2 is brought into a conductive state, a predetermined constant voltage VIni is applied to the gate electrode of the drive transistor TRDrv.

Reference sign NDg denotes a node including an element connected to the gate electrode of the drive transistor TRDrv. The node NDg is configured by connecting the other end of the second switching element TRWS2 and one electrode of the capacitance unit CHD to the gate electrode of the drive transistor TRDrv.

Reference sign NDs denotes a node including an element connected to the other source/drain region of the drive transistor TRDrv. The node NDs is configured by connecting the anode electrode of the light emitting unit ELP and the other end of the first switching element TRWS1 to the other source/drain region of the drive transistor TRDrv.

Figure 16:
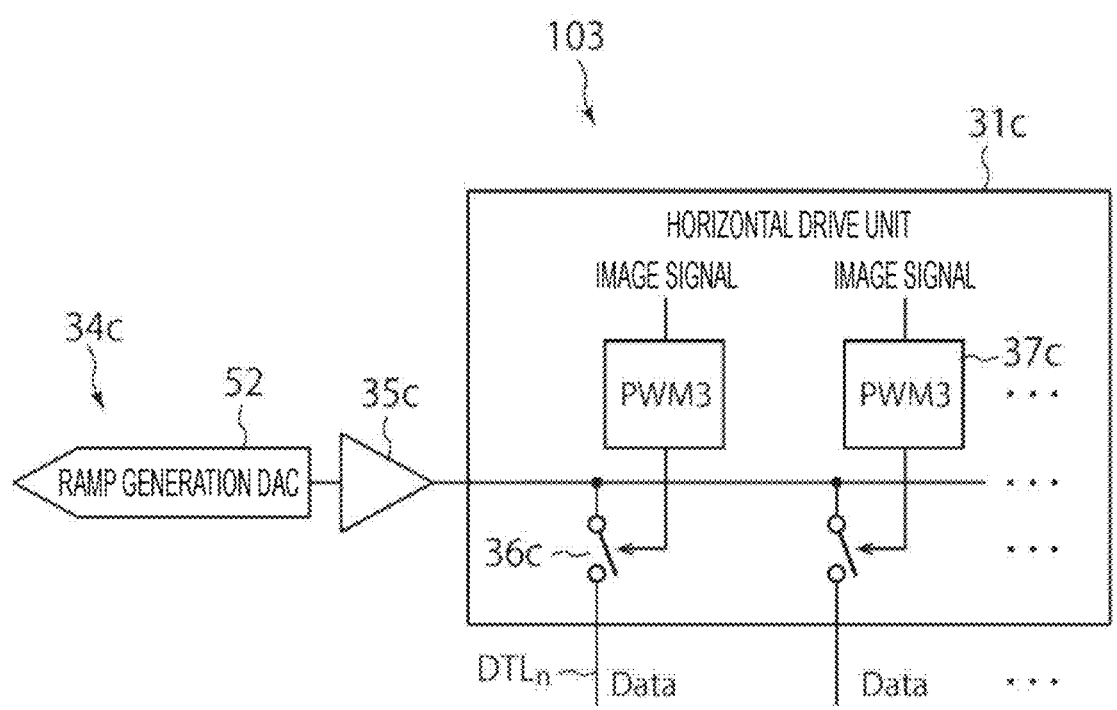
FIG. 16 is a block diagram illustrating an internal configuration of a data driver.

FIG. 16 is a block diagram illustrating an internal configuration of the data driver 103. As illustrated in FIG. 16, the data driver 103 includes a horizontal drive unit 31c, a ramp signal generation circuit 34c, and a ramp buffer 36c. The horizontal drive unit 31c and the ramp buffer 36c are connected to the data line DTLn.

The ramp signal generation circuit 34c is a circuit that generates a ramp signal. The ramp signal generation circuit 34c includes a signal ramp generation DAC 52. The signal ramp generation DAC 52 outputs a ramp wave voltage whose voltage level continuously changes.

The ramp buffer 35c corresponds to a buffer amplifier, and outputs the input ramp signal to the horizontal drive unit 31c. That is, the ramp buffer 35c outputs a ramp wave voltage whose voltage level continuously changes for setting the signal voltage of the capacitance CHD in the pixel circuit 300. The horizontal drive unit 31c includes a switch element 36ca and a PWM 37c for each column.

In a case of outputting the ramp wave voltage generated by the signal ramp generation DAC 52, the PWM 37c generates a pulse width modulation (PWM) signal from the digital image signal. The PWM signal is a pulse signal of a constant period, and is a signal having a pulse width corresponding to a digital image signal. That is, the PWM signal is a pulse signal having a duty corresponding to the digital image signal.

Figure 17:
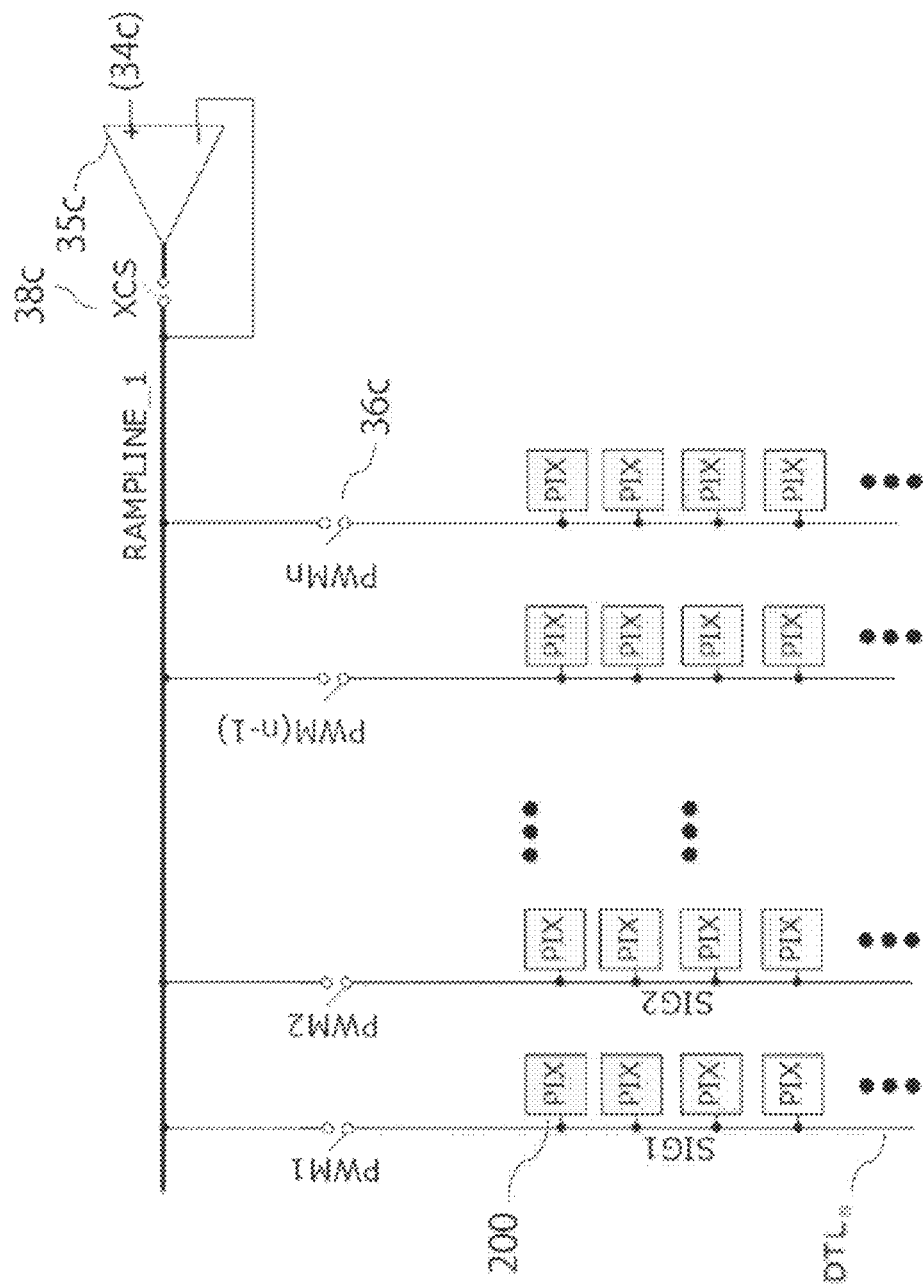
FIG. 17 is a diagram illustrating a more detailed connection example between a ramp buffer and a data line DTLn according to the second embodiment.

FIG. 17 is a diagram illustrating a more detailed connection example between the ramp buffer 35c and the data line DTLn according to the second embodiment. The display device 1 according to the second embodiment has a configuration in which only the ramp buffer 35c is provided and the switch 39 for charge sharing is not provided. In FIG. 17, RAMPLINE_1 indicates wiring to which the ramp voltage output from the ramp buffer 35c is supplied. Further, PWM1 to PWMn indicate PWM signals output from the PWM 37a, respectively. XCS is a control signal for the switch 38c, and sets a low impedance at a high level and a high impedance at a low level.

Figure 18:
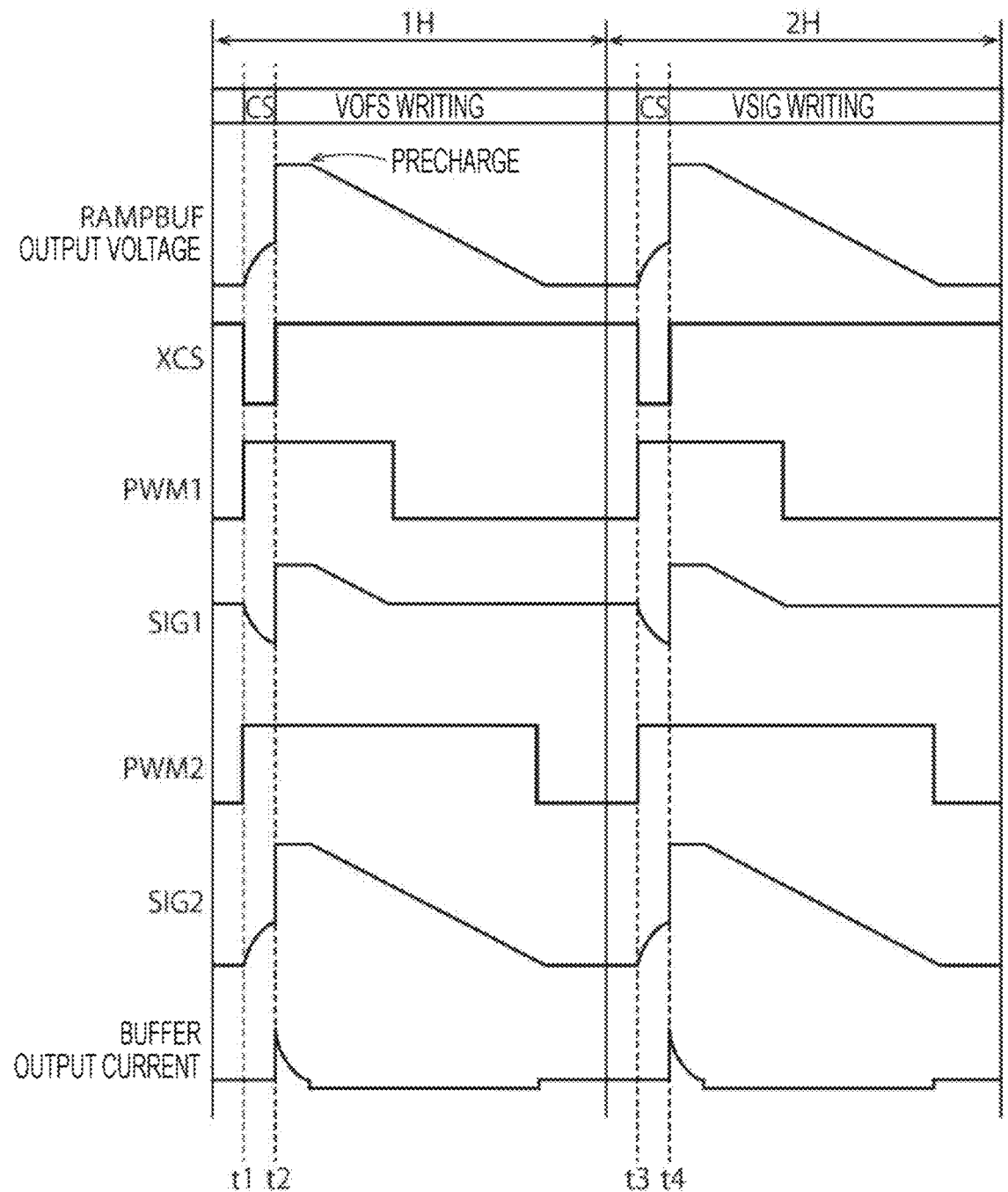
FIG. 18 is a time chart illustrating an operation example of a display device 1 according to the second embodiment.

FIG. 18 is a time chart illustrating an operation example of the display device 1 according to the second embodiment. A RAMPBUF output voltage which is a voltages to be output to RAMPLINE_1, an XCS signal, a PWM1 signal Corresponding to the data line DTL1, a SIG1 signal indicating the voltage of the data line DTL1, a PWM2 signal corresponding to the data line DTL2, and a SIG2 signal indicating the voltage of the data line DTL2 are illustrated from the top. The buffer output current indicates a current to be output to RAMPLINE_1.

As illustrated in FIG. 18, at timings t1 and t3, which are the start of the charge sharing period CS, the XCS signal becomes low level, and the switch 38c becomes high impedance. At this time, the switches 36c of the data lines DTL1 to DTLn are in a conductive state. Furthermore, the transistor TRWS1 in the pixel circuit 200 (see FIG. 15) is in a conductive state, and the transistors TRWS2 and TRDRV are in a non-conductive state. As a result, the accumulated charge of the capacitance CHD in each pixel circuit 200 is shared between the timings t1 to t2 and t3 to t4.

Next, at timings t2 and t4, which are the ends of the charge sharing period CS, the XCS signal goes to a high level, and the switch 38c goes to low impedance. Furthermore, the pixel circuit 200 (see FIG. 15) is in a normal driving state, and a ramp voltage for setting a signal voltage is applied.

As described above, at the timings t2 and t4, the state of the potential of RAMPLINE_1 changes to the high potential side. In addition, it is also possible to suppress an excessive current of the buffer output current flowing at the timings t2 and t4. As can be seen from these, the power supply capacitance of the ramp signal generation circuit 34 can be reduced, and the current consumption of the pixel array unit 11 can be suppressed. In addition, since the accumulated charge of the capacitance CHD of each pixel circuit 200 is shared, it is possible to suppress generation of the pixel circuit 200 with specifically reduced charge. Therefore, even at the application start timing of the ramp voltage at the timings t2 and t4, it is also possible to suppress an excessive current of the buffer output current that occurs inrush to the pixel circuit 200 in which the charge is specifically reduced. As a result, the power supply capacitance of the ramp signal generation circuit 34 can be reduced, and the current consumption of the pixel array unit 11 can be suppressed.

As described above, in the display device 1 according to the present embodiment, before the ramp signal generation circuit 34 performs the precharge operation for setting the signal voltage, the data lines DTL1 to DTLn are brought into the conductive state. As a result, the accumulated charges of the capacitance CHD of each pixel circuit 200 in the conductive state between the plurality of data lines DTL1 to DTLn are shared, and the state of the potential of RAMPLINE_1 changes to the high potential side. As a result, the power supply capacitance of the ramp signal generation circuit 34 can be reduced, and the current consumption of the pixel array unit 11 can be suppressed.

Third Embodiment

The display device 1 according to the third embodiment is different from the display device 1 according to the second embodiment in that control is performed independently for an odd-numbered row and an even-numbered row of each pixel circuit 15. Hereinafter, differences from the display device 1 according to the second embodiment will be described.

Figure 19:
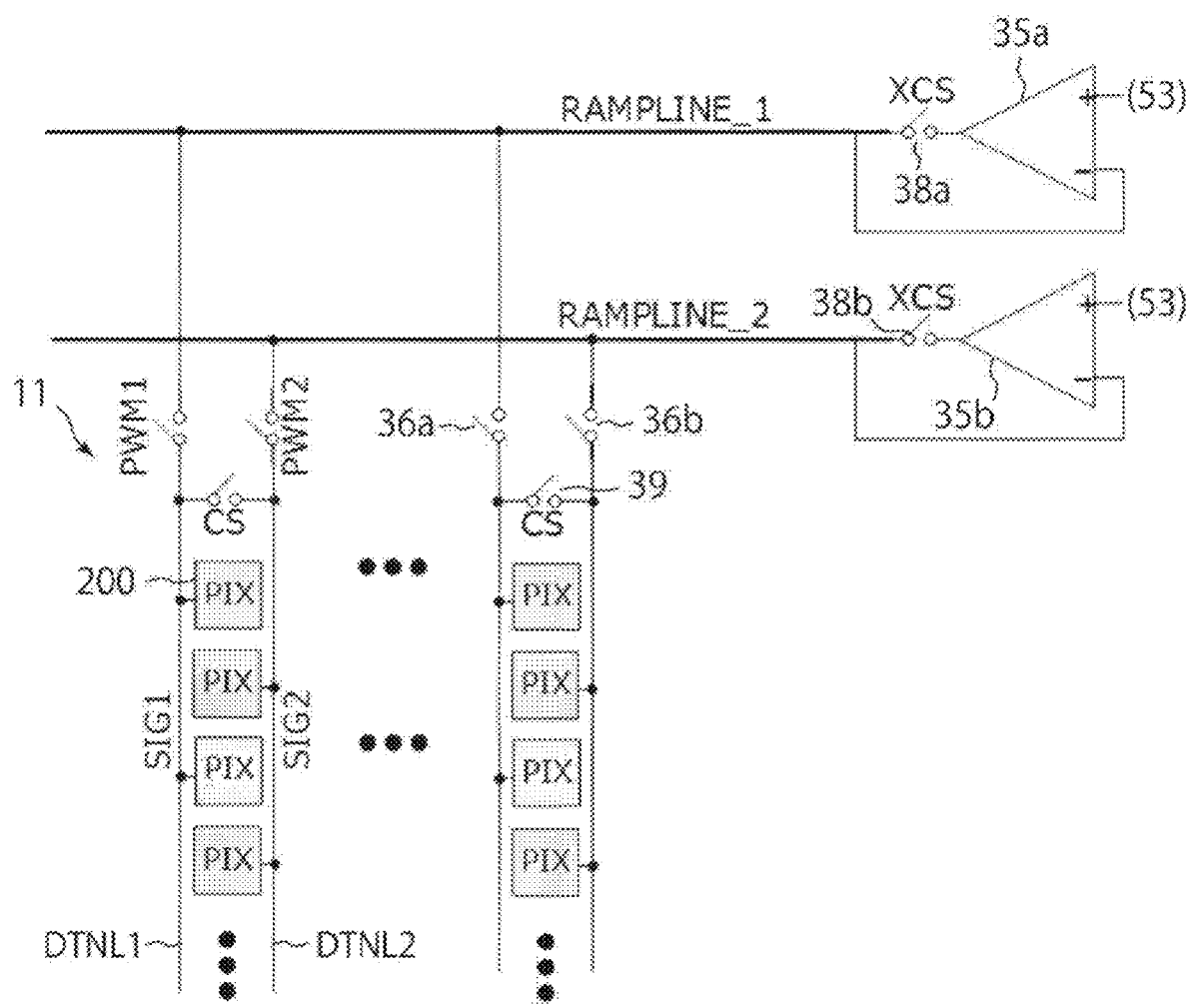
FIG. 19 is a diagram illustrating a more detailed connection example between a ramp buffer and a data line according to the second embodiment.

FIG. 19 is a diagram illustrating a more detailed connection example between the ramp buffers 35a and 35b and the data lines DTNL1 to DTNL n. The ramp buffers 35a and 35b have changeover switches 38a and 38b, respectively. It is possible to increase the impedance of the switches 38a and 38b.

In addition, a switch 39 for charge sharing is connected between the adjacent data lines DINL1 and DTNL2. The switch 39 is, for example, a transistor, and brings the adjacent data lines DTNL1 and DTNL2 into a conductive state or a non-conductive state.

Furthermore, in FIG. 19, RAMPLINE_1 indicates wiring to which the ramp voltage output from the ramp buffer 35a is supplied, and RAMPLINE_2 indicates wiring to which the ramp voltage output from the ramp buffer 35b is supplied. Further, PWM1 indicates a PWM signal output from PWM corresponding to the data line DTNL1, and PWM2 indicates a PWM signal output from PWM corresponding to the data line DTNL2. The PWM1 signal and the PWM2 signal bring the switches 36a and 36b into a conductive state at a high level and bring the switches into a non-conductive state at a low level.

In addition, CS represents a switching signal of the switch 39. The CS signal brings the switch 39 into a conductive state at a high level and brings the switch into a non-conductive state at a low level.

Figure 20:
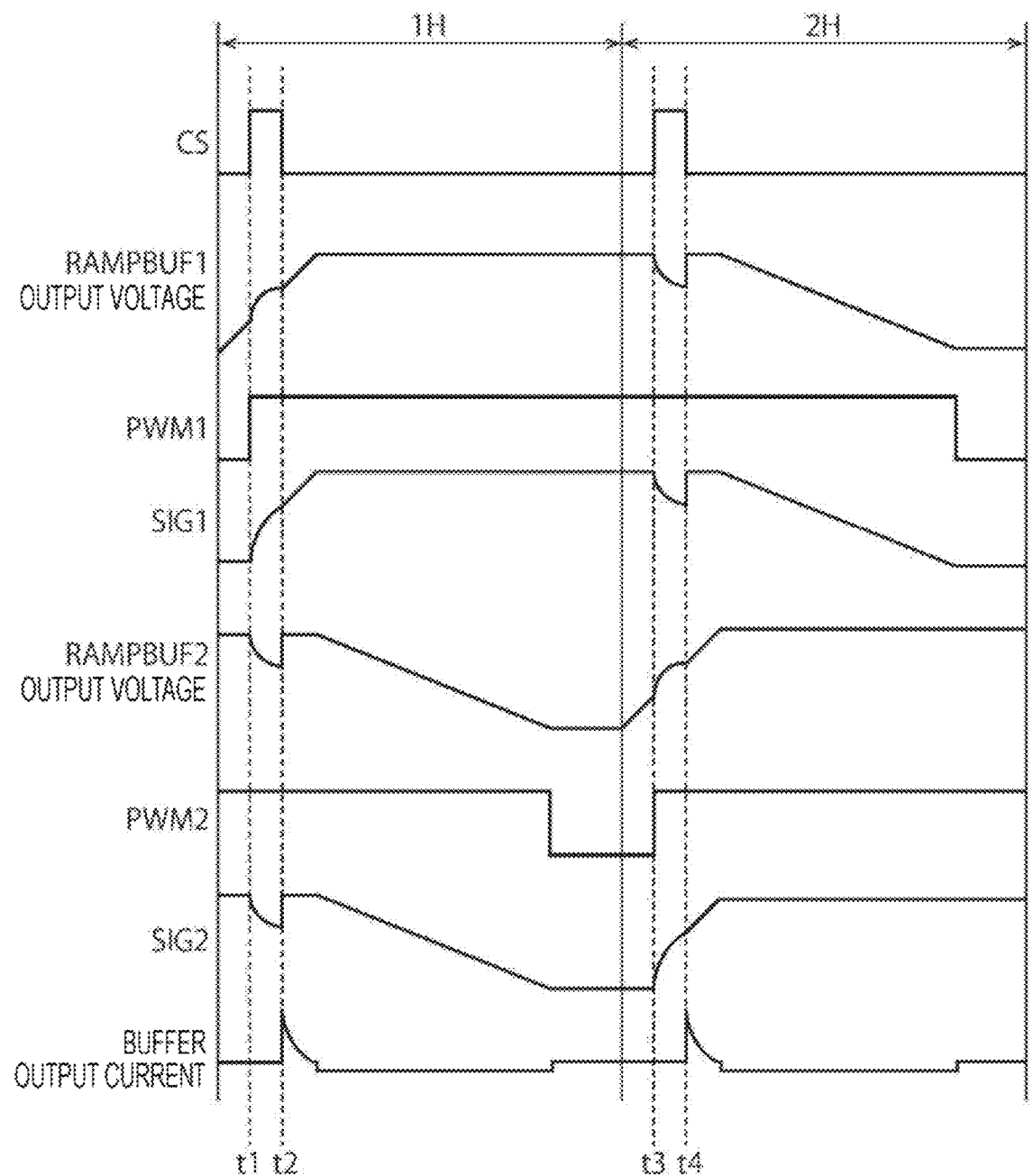
FIG. 20 is a time chart illustrating an operation example of a display device according to a third embodiment.

FIG. 20 is a time chart illustrating an operation example of the display device 1 according to the third embodiment. From the top, the CS signal, the RAMPBUF1 voltage which is the voltage output to RAMPLINE_1, the PWM1 signal, the SIG1 signal indicating the voltage of the data line 70a, the RAMPBUF2 voltage which is the voltage output to RAMPLINE_2, and the PWM2 signal, and the SIG2 signal indicating the voltage of the data line 70b are illustrated. The buffer output current indicates a current to be output to RAMPLINE_2. Here, operation examples corresponding to the adjacent data lines DTNL1 and DTNL2 will be described, but operations corresponding to other data lines are similar.

As illustrated in FIG. 20, the CS signal goes to a high level at timing t1, which is the start of the charge sharing period CS, and the switches 38a and b go to high impedance. At this time, the switch 39 between the data line DTL1 and the data line DTLn is in a conductive state. Furthermore, the transistor TRWS1 in the pixel circuit 200 (see FIG. 15) is in a conductive state, and the transistors TRWS2 and TRDRV are in a non-conductive state. As a result, the accumulated charge of the capacitance CHD in each pixel circuit 200 is shared between the timings t1 to t2 and t3 to t4.

Next, at timing t2, the CS signal becomes a low level, and the switch 39 is brought into a non-conductive state. In addition, at timing t2, the switches 38a and 38b are in a low impedance state. Meanwhile, each pixel circuit 200 (see FIG. 15) also starts a normal driving operation. Then, a ramp voltage for signal voltage setting is output to RAMPLINE_1.

Such processing is also performed in the horizontal period H2. That is, the CS signal goes to a high level at timing t3 of the second horizontal period 2H, and the switch 39 is brought into a conductive state. In addition, at timing t3, the switches 38a and 38b are in a high-impedance state.

Next, at timing t4, the CS signal becomes a low level, and the switch 39 is brought into a non-conductive state. In addition, at timing t2, the switches 38a and 38b are in a low impedance state. Meanwhile, each pixel circuit 200 (see FIG. 15) also starts a normal driving operation. Then, a ramp voltage for signal voltage setting is output to RAMPLINE_4.

As described above, before the ramp voltage is applied to RAMPLINE_1 and RAMPLINE_2 at the timings t2 and t4, the switch 39 between the data line DTL1 and the data line DTLn is brought into a conductive state, and the accumulated charges of the capacitance CHD in each pixel circuit 200 are shared. As a result, an excessive current of the buffer output current flowing at the timings t2 and t4 can also be suppressed. As can be seen from these, the power supply capacitance of the ramp signal generation circuit 34 can be reduced, and the current consumption of the pixel array unit 11 can be suppressed.

Figure 21:
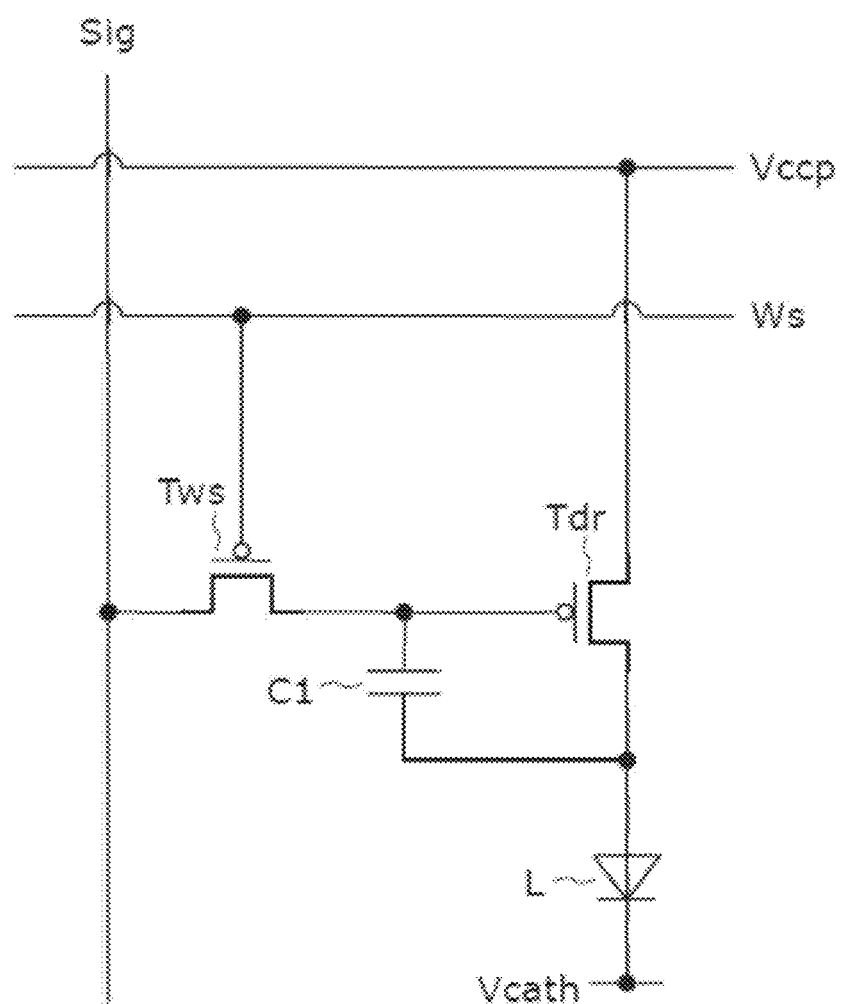
FIG. 21 is a diagram illustrating a pixel circuit according to an embodiment.
Figure 24:
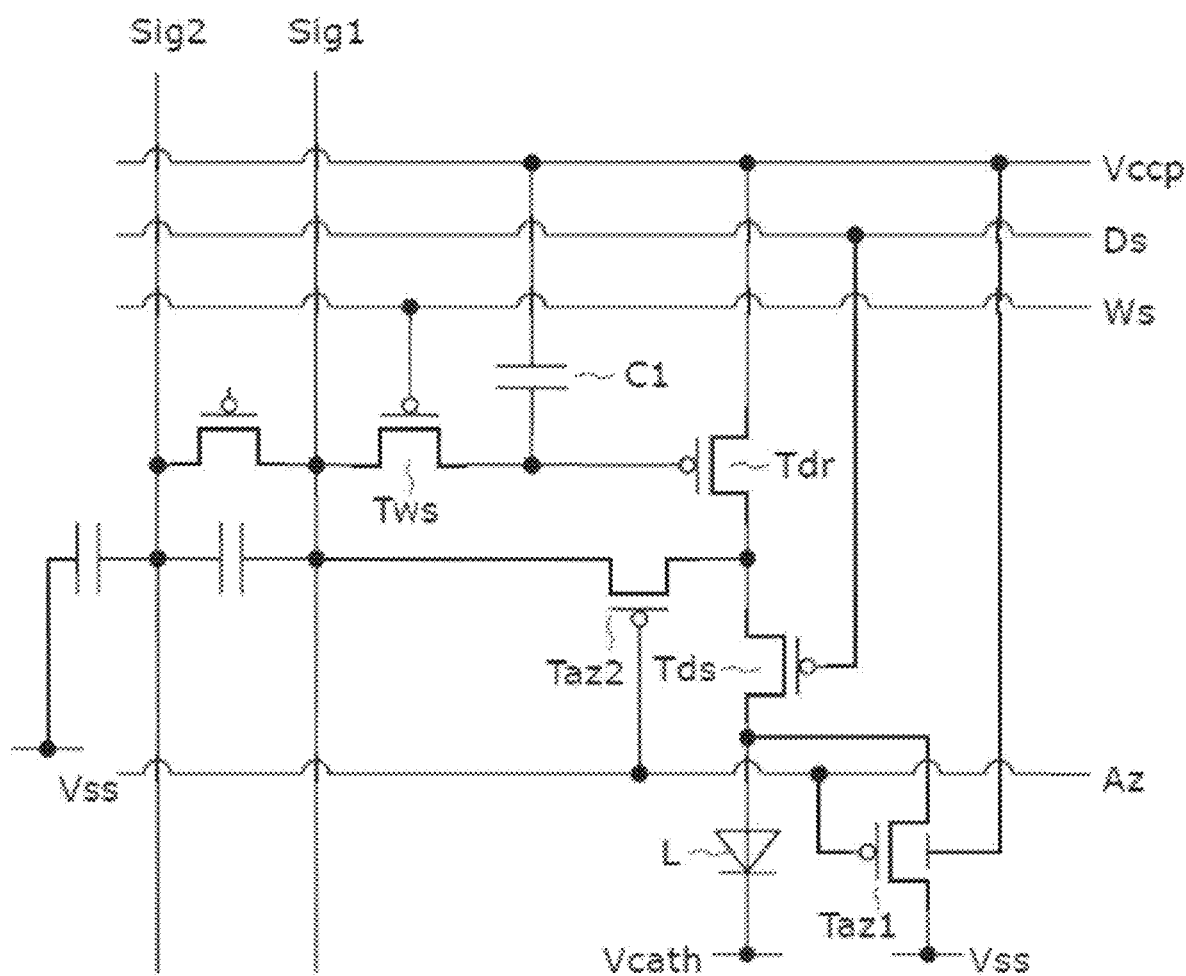
FIG. 24 is a diagram illustrating a pixel circuit according to an embodiment.

FIG. 21 is a diagram illustrating an example of a pixel circuit. FIG. 24 illustrates a pixel circuit having a very simple configuration. The pixel circuit includes transistors Tws and Tdr, a capacitor C1, and a light emitting element L.

The light emitting element L is an LED element such as an LED, an OLED, or an M-OLED, for example. In the following description, the light emitting element L is an element such as an LED or the like, but is not limited to these LEDs. A similar form can be applied as long as the light emitting element L is an element that emits light when a voltage is applied or when a current flows. The light emitting element L emits light when a current flows from the anode to the cathode. The cathode is connected to a reference voltage Vcath (for example, 0 V). The anode of the light emitting element L is connected to the drain of the transistor Tdr, and one terminal of the first capacitor C1.

The transistor Tws is a p-type MOSFET, for example, and is a transistor (a write transistor) that controls writing of a pixel value. In the transistor Tws, a signal Sig indicating a pixel value is input to the source, the drain is connected to the other end of the capacitor C1 and the gate of the transistor Tdr, and a signal Ws for write control is applied to the gate. The transistor Tws causes a drain current according to the signal Sig to flow with the signal Ws, and controls writing into the capacitor C1 and the gate potential of the transistor Tdr. When the transistor Tws is turned on, a voltage based on the magnitude of the signal Sig is charged (written) in the capacitor C1, and the light emission intensity of the light emitting element L is controlled by the charge amount of the capacitor C1.

The transistor Tds is a p-type MOSFET, for example, and is a transistor that controls driving for applying a current based on the potential corresponding to the written pixel value to the light emitting element L. The transistor Tds is a transistor (drive transistor) that has a source connected to a power supply voltage Vccp for driving the MOS, a drain connected to the source of the transistor Tdr, and a gate to which a drive signal Ds is applied, and supplies a drive current to the light emitting element L. A drain current flows in accordance with the drive signal Ds, and the drain potential of the transistor Tdr is raised.

As a simple example, the pixel circuit 15 emits light by performing writing based on the signal Sig for determining the light emission intensity for each pixel in this manner and passing a drain current corresponding to the intensity of the written signal to the light emitting element L.

Figure 22:
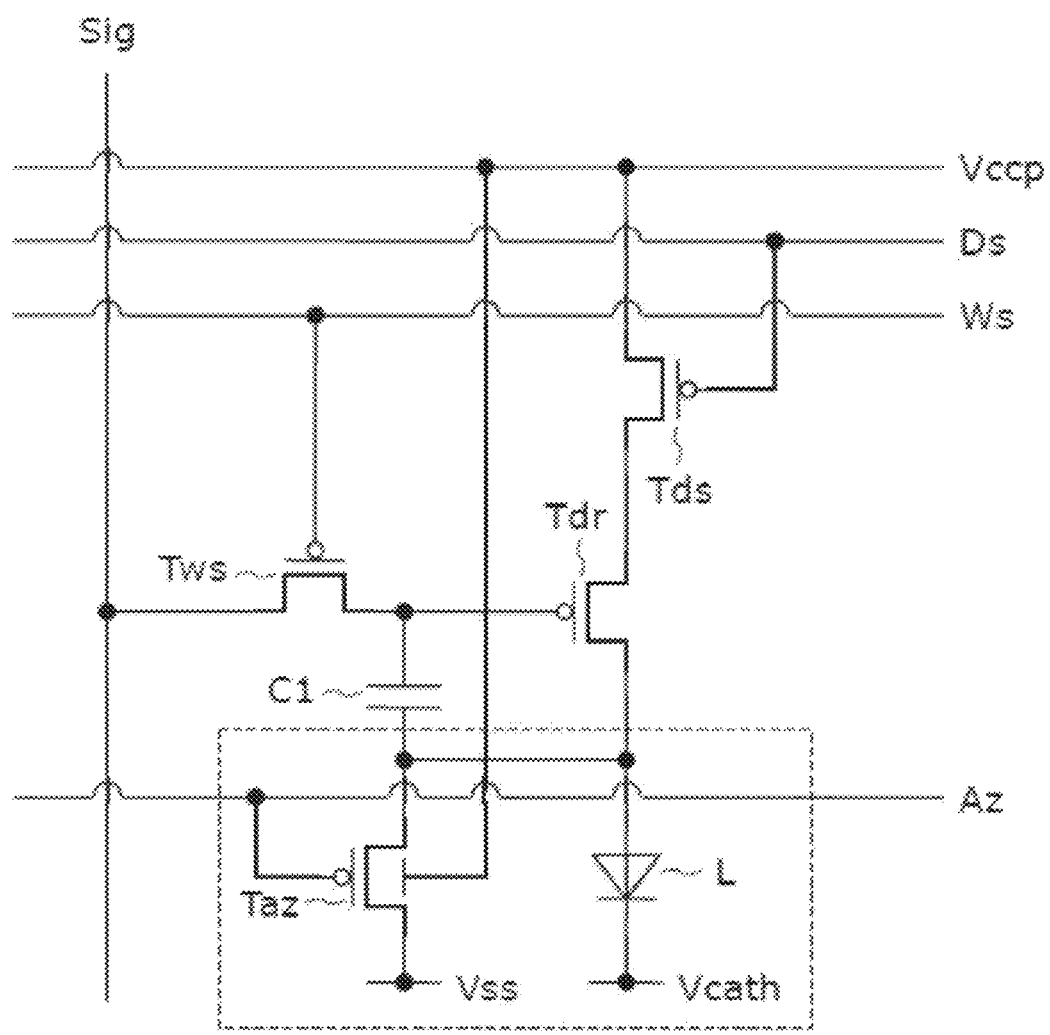
FIG. 22 is a diagram illustrating a pixel circuit according to an embodiment.

FIG. 22 is a diagram illustrating another example of a pixel circuit. As a general simple example, the pixel circuit 15 may include a first transistor Taz, a second transistor Tws, a third transistor Tds, a fourth transistor Tdr, and a first capacitor C1.

The anode of the light emitting element L is connected to the source of the first transistor Taz, the drain of the fourth transistor Tdr, and one terminal of the first capacitor C1.

The first transistor Taz is a p-type MOSFET, for example, and has a source connected to the anode of the light emitting element L, a drain connected to a voltage Vss, and a gate to which a signal Az is applied. The first transistor Taz is a transistor that initializes the potential of the anode of the light emitting element L, in accordance with the signal Az. The voltage Vss is a reference voltage at the power supply voltage, for example, and may represent a grounded state or may be a potential of 0 V.

The first capacitor C1 is a capacitor for controlling the potential on the anode side of the light emitting element L.

The second transistor Tws is a p-type MOSFET, for example, and is a transistor that controls writing of a pixel value. In the second transistor Tws, the signal Sig indicating a pixel value is input to the source, the drain is connected to the other end of the first capacitor C1 and the gate of the fourth transistor Tdr, and the signal Ws for write control is applied to the gate. The second transistor Tws causes a drain current according to the signal Sig to flow with the signal Ws, and controls writing into the first capacitor C1 and the gate potential of the fourth transistor Tdr. When the second transistor Tws is turned on, a voltage based on the magnitude of the signal Sig is charged (written) in the first capacitor C1, and the light emission intensity of the light emitting element L is controlled by the charge amount of the first capacitor C1.

The third transistor Tds is a p-type MOSFET, for example, and is a transistor that controls driving for applying a current based on the potential corresponding to the written pixel value to the light emitting element L. The third transistor Tds has a source connected to the power supply voltage Vccp for driving the MOS, a drain connected to the source of the fourth transistor Tdr, and a gate to which the drive signal Ds is applied. A drain current flows in accordance with the drive signal Ds, and the drain potential of the fourth transistor Tdr is raised.

The fourth transistor Tdr is a p-type MOSFET, for example, and applies a current based on the signal Sig written by the second transistor Tws to the light emitting element L, by driving the third transistor Tdr. The fourth transistor Tdr has a source connected to the drain of the third transistor Tds, a drain connected to the anode of the light emitting element L, and a gate connected to the drain of the second transistor Tws. In the fourth transistor Tdr, the signal Sig stored by the second transistor Tws and the first capacitor C1 is applied to the gate. Accordingly, the source potential becomes a sufficiently large value, and thus, the drain current corresponding to the signal Sig flows. When the drain current flows, the light emitting element L emits light with the intensity (luminance) corresponding to the signal Sig.

Similarly to the above, as a simple example, the pixel circuit 15 emits light by performing writing based on the signal Sig for determining the light emission intensity for each pixel and applying the drain current corresponding to the intensity of the written signal to the light emitting element L in this manner, as described above.

The first transistor Taz is a transistor that performs a quick discharge operation at a timing after light emission to initialize a written state. The body of the first transistor Taz needs to be held at a sufficiently large potential for appropriate driving while the pixel circuit 15 operates (light emission, extinction), and the power supply voltage Vccp is applied, for example.

Since the first transistor Taz is off while the light emitting element L emits light, a voltage sufficiently higher than a threshold voltage is applied to the gate. In a case where the light emitting element L emits light, a voltage higher than the voltage Vccp is applied to the gate of the first transistor Taz, for example. As an example, the voltage Vccp is 9 V, and a voltage of 10 V is applied to the first transistor Taz in the light emission state.

On the other hand, while the light emitting element L is quenched, there is a timing at which the first transistor Taz is turned on to discharge the written charge. At this timing for turning on the first transistor Taz, the gate of the first transistor Taz is desirably set to a potential sufficiently lower than the threshold voltage. For example, a voltage (for example, 0 V) equivalent to the voltage Vss is applied to the gate of the first transistor Taz.

In this case, in the first transistor Taz, a voltage of 9 V is applied to the body, and a voltage of 0 V is applied to the gate, for example. Therefore, there is a possibility that the time during which a high voltage is applied between the body and the gate of the first transistor Taz will be long. The longer this time, the higher the possibility that the life of the first transistor Taz becomes shorter, and the performance is degraded. As the performance of the first transistor Taz is degraded, appropriate charging and discharging cannot be performed in the pixel circuit 15 in some cases. In the present disclosure, the discharge timing of the first transistor Taz may be appropriately controlled.

Figure 23:
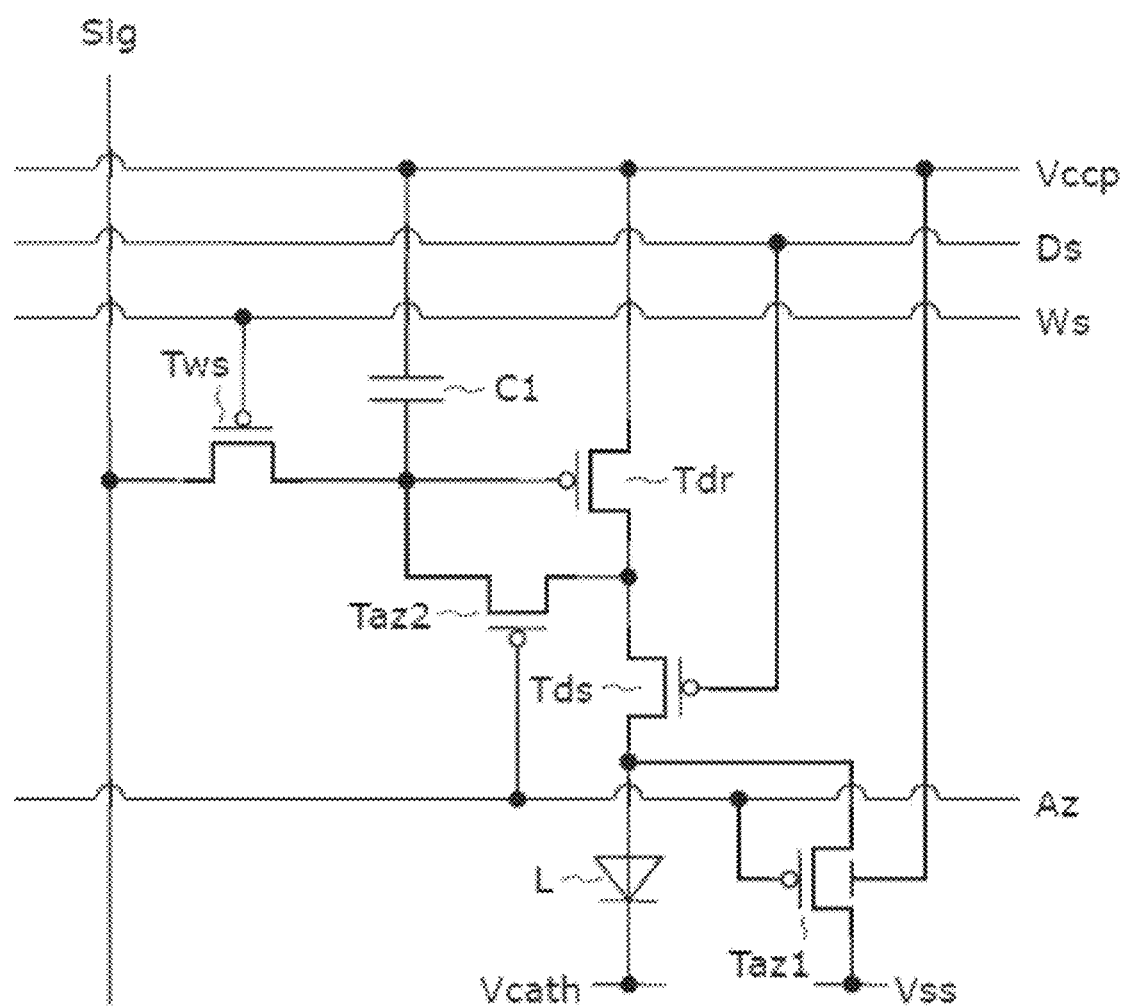
FIG. 23 is a diagram illustrating a pixel circuit according to an embodiment.

FIG. 23 is a diagram illustrating another example of the pixel circuit 15. In FIG. 23, Taz1 and Taz2 are included as initialization transistors. In such a mode, a voltage similar to that in each of the modes described above is also applied to Taz1. Furthermore, a similar voltage may also be applied to Taz2 at the same timing.

As described above, by performing control in a similar manner in a case where a plurality of initialization transistors is present, it is possible to shorten the time during which a high potential is applied between the bodies and the gates of the initialization transistors.

FIG. 24 is a diagram illustrating another example of the pixel circuit 15. As illustrated in FIG. 24, in a case where there are two kinds of signals indicating the intensity of the pixel, which are Sig1 and Sig2, similar control can be performed for the initialization transistors Taz1 and Taz2.

Figure 25:
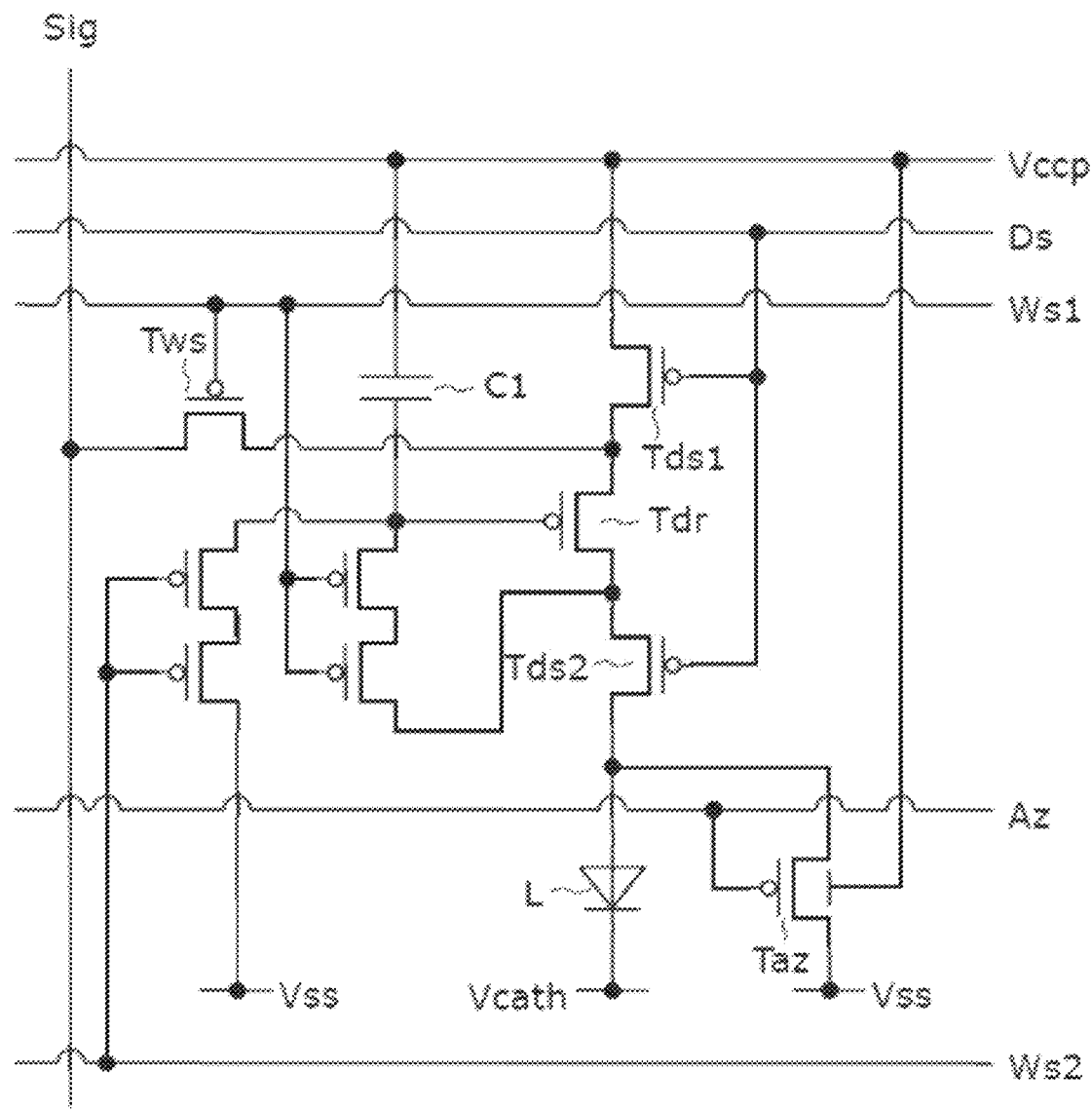
FIG. 25 is a diagram illustrating a pixel circuit according to an embodiment.

FIG. 25 is a diagram illustrating another example of the pixel circuit 15. The pixel circuit 15 is controlled with Ws2 as an offset, which is a signal for performing write control on a previous line scanned first, in addition to Ws1, which is a signal for performing write control on the pixel. In such a mode that depends on control by another line, the present disclosure can also be appropriately applied. Further, to stabilize charging, the pixel circuit 15 includes a write transistor that uses an offset and assists the second transistor Tws.

Figure 26:
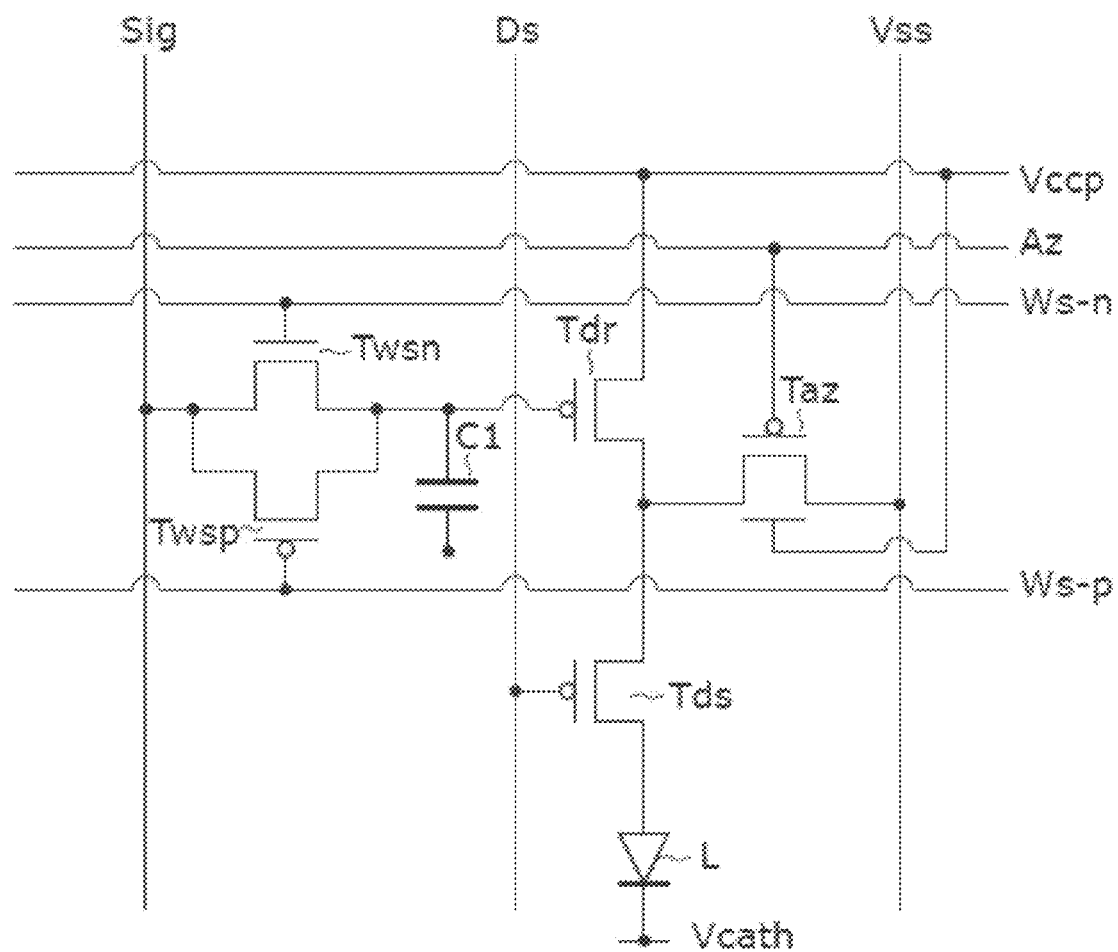
FIG. 26 is a diagram illustrating a pixel circuit according to an embodiment.

FIG. 26 is a diagram illustrating another example of the pixel circuit 15. To control Ws in a complementary manner, the pixel circuit 15 includes transistors Tws_n and Tws_p, instead of the second transistor Tws. In such a configuration, control according to the present disclosure can be similarly adopted.

Note that, in the above description, only the relevant components of the present disclosure have been explained with respect to appropriate components such as other circuits necessary for display, but the display device 1 appropriately includes components (not illustrated) necessary for displaying a video or the like, in addition to the relevant components.

(Application Examples of Display Device 1 According to Present Disclosure)

First Application Example

Figure 27:
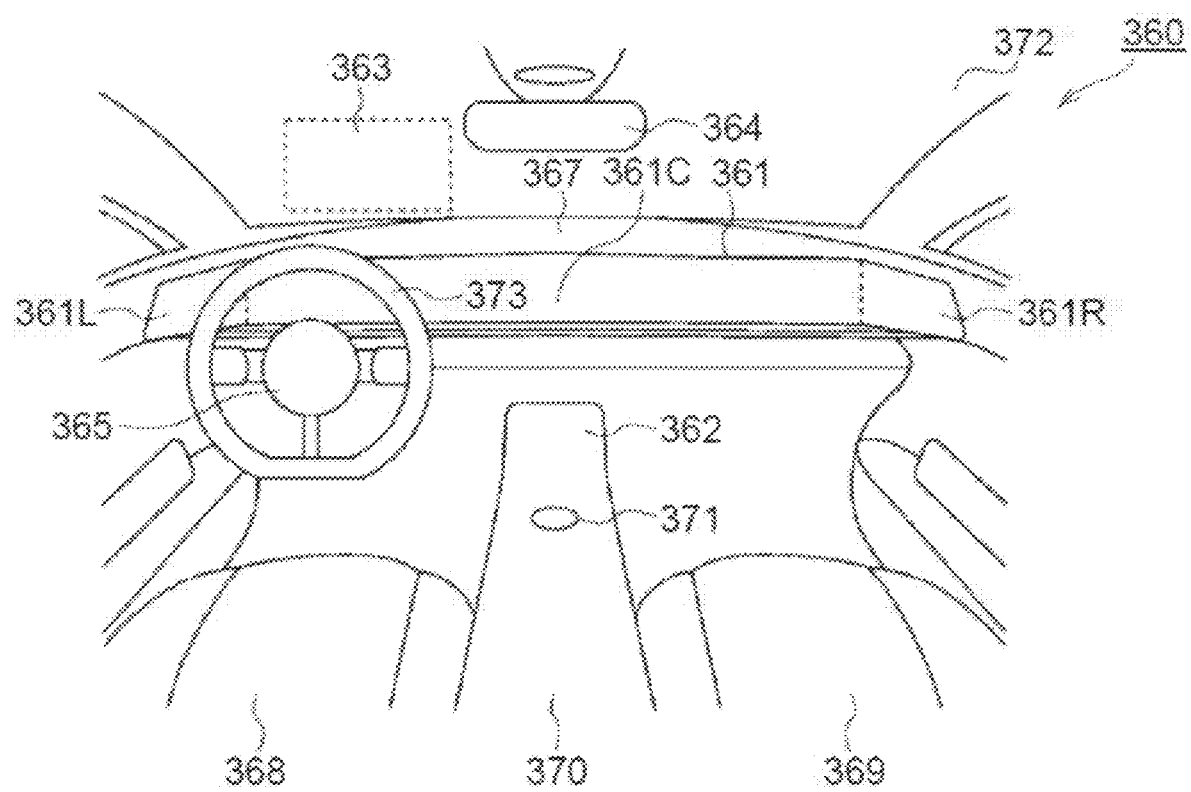
FIG. 27 is a diagram illustrating an internal state of a vehicle from the rear to the front of the vehicle.
Figure 28:
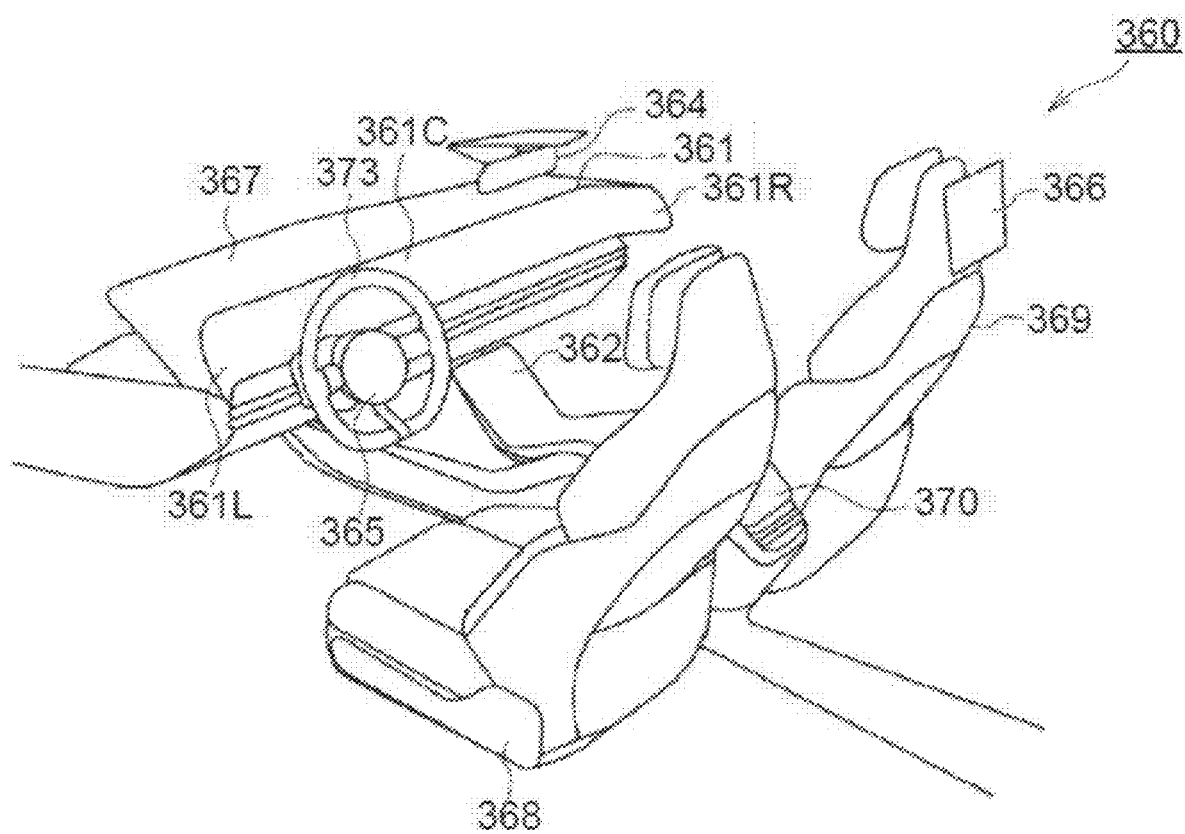
FIG. 28 is a diagram illustrating an internal state of a vehicle from an oblique rear to an oblique front of the vehicle.

The display device 1 according to the present disclosure can be used for various applications. FIGS. 27 and 28 are diagrams illustrating an internal configuration of a vehicle 360 which is a first application example of the display device 1 according to the present disclosure. FIG. 27 is a diagram illustrating a state of the inside of the vehicle 360 from the rear to the front of the vehicle 360, and FIG. 28 is a diagram illustrating a state of the inside of the vehicle 360 from the oblique rear to the oblique front of the vehicle 360.

The vehicle 360 in FIGS. 27 and 28 includes a center display 361, a console display 362, a head-up display 363, a digital rearview mirror 364, a steering wheel display 365, and a rear entertainment display 366.

The center display 361 is disposed on a dashboard 367 at a location facing a driver's seat 368 and a passenger seat 369. FIGS. 27 and 28 illustrate an example of the center display 361 having a horizontally long shape extending from the driver's seat 368 side to the passenger seat 369 side, but the screen size and the arrangement location of the center display 361 are arbitrary. The center display 361 can display information sensed by various sensors. As a specific example, the center display 361 can display an image captured by an image sensor, an image of the distance to an obstacle in front of or on a side of the vehicle, the distance being measured by a ToF sensor, a passenger's body temperature detected by an infrared sensor, and the like. The center display 361 can be used to display, for example, at least one piece of safety-related information, operation-related information, a lifelog, health-related information, authentication/identification-related information, or entertainment-related information.

The safety-related information is information of doze sensing, looking-away sensing, sensing of mischief of a child riding together, presence or absence of wearing of a seat belt, sensing of leaving of an occupant, and the like, and is information sensed by the sensor arranged to overlap with a back surface side of the center display 361, for example. The operation-related information senses a gesture related to an operation by an occupant, using a sensor. Gestures to be sensed may include an operation of various kinds of equipment in the vehicle 360. For example, operations of air conditioning equipment, a navigation device, an AV device, a lighting device, and the like are detected. The lifelogs include lifelogs of all the occupants. For example, the lifelog includes an action record of each occupant in the vehicle. By acquiring and storing the lifelog, it is possible to check a state of the occupant at a time of an accident. In the health-related information, the health condition of the occupant is estimated on the basis of the body temperature of the occupant detected by using a temperature sensor. Alternatively, the face of the occupant may be imaged by using an image sensor, and the health condition of the occupant may be estimated from the imaged facial expression. Further, a conversation may be made with an occupant in automatic voice, and the health condition of the occupant may be estimated on the basis of the contents of a response from the occupant. The authentication/identification-related information includes a keyless entry function of performing face authentication using a sensor, a function of automatically adjusting a seat height and position through face identification, and the like. The entertainment-related information includes a function of detecting, with a sensor, operation information about an AV device being used by an occupant, a function of recognizing the face of the occupant with sensor and providing content suitable for the occupant through the AV device, and the like.

The console display 362 can be used to display lifelog information, for example. The console display 362 is disposed near a shift lever 371 of a center console 370 between the driver's seat 368 and the passenger seat 369. The console display 362 can also display information detected by various sensors. Furthermore, the console display 362 may display an image of the surroundings of the vehicle captured with an image sensor, or may display an image of the distance to an obstacle in the surroundings of the vehicle.

The head-up display 363 is virtually displayed behind a windshield 372 in front of the driver's seat 368. The head-up display 363 can be used to display at least one piece of the safety-related information, the operation-related information, the lifelog, the health-related information, the authentication/identification-related information, or the entertainment-related information, for example. Being virtually disposed in front of the driver's seat 368 in many cases, the head-up display 363 is suitable for displaying information directly related to operations of the vehicle 360, such as the speed, the remaining amount of fuel (battery), and the like of the vehicle 360.

The digital rearview mirror 364 can not only display the rear of the vehicle 360 but also display the state of an occupant in the rear seat, and thus, can be used to display the lifelog information by disposing a sensor on the back surface side of the digital rearview mirror 364 in an overlapping manner, for example.

The steering wheel display 365 is disposed near the center of a steering wheel 373 of the vehicle 360. The steering wheel display 365 can be used to display at least one piece of the safety-related information, the operation-related information, the lifelog, the health-related information, the authentication/identification-related information, or the entertainment-related information, for example. In particular, since the steering wheel display 365 is close to the driver's hand, it is suitable for displaying lifelog information such as the body temperature of the driver, or for displaying information regarding the operation of an AV device, air conditioning equipment, or the like.

The rear entertainment display 366 is attached to the back side of the driver's seat 368 or the passenger seat 369, and is an occupant in the rear seat to enjoy viewing/listening. The rear entertainment display 366 can be used to display at least one piece of the safety-related information, the operation-related information, the lifelog, the health-related information, the authentication/identification-related information, or the entertainment-related information, for example. In particular, as the rear entertainment display 366 is located in front of the occupant in the rear seat, information related to the occupant in the rear seat is displayed. For example, information regarding the operation of the AV device or the air conditioning equipment may be displayed, or a result of measuring the body temperature or the like of the occupant in the rear seat by the temperature sensor may be displayed.

As described above, disposing a sensor on the back surface side of the display device 1 makes it possible to measure the distance to an object existing in the surroundings. Optical distance measurement methods are roughly classified into a passive type and an active type. By a method of the passive type, distance measurement is performed by receiving light from an object, without projecting light from a sensor to the object. Methods of the passive type include a lens focus method, a stereo method, a monocular vision method, and the like. Methods of the active type include distance measurement that is performed by projecting light onto an object, and receiving reflected light from the object with a sensor to measure the distance. Methods of the active type include an optical radar method, an active stereo method, an illuminance difference stereo method, a moire topography method, an interference method, and the like. The display device 1 according to the present disclosure can be used in distance measurement by any of these methods. With a sensor disposed on the back surface side of the display device 1 according to the present disclosure in an overlapping manner, distance measurement of the passive type or the active type described above can be performed.

Second Application Example

The display device 1 according to the present disclosure can be applied not only to various displays used in vehicles but also to displays mounted on various electronic apparatuses.

Figure 29:
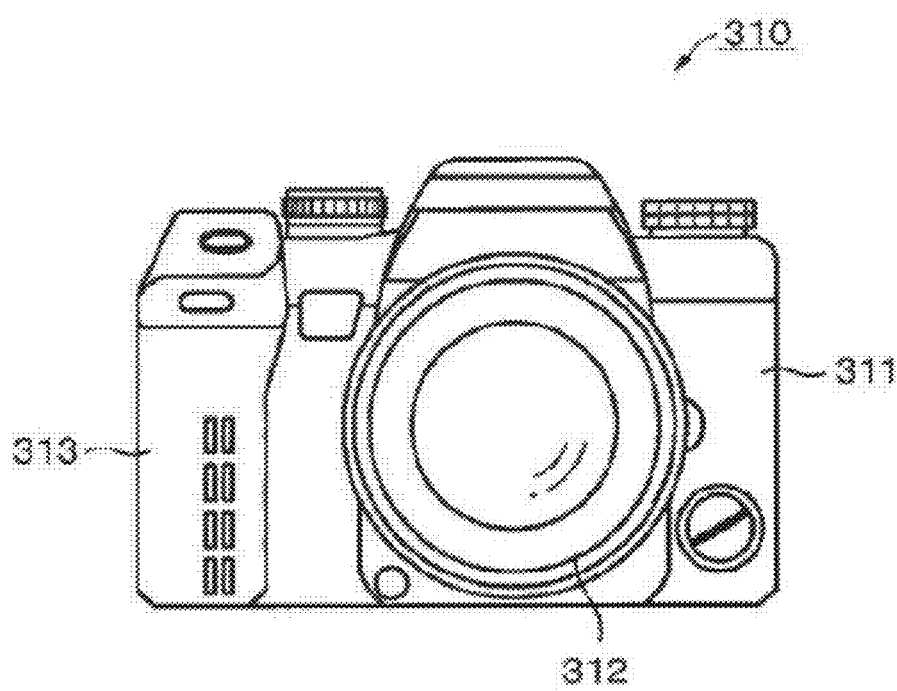
FIG. 29 is a front view of a digital camera as a second application example of an electronic apparatus.
Figure 30:
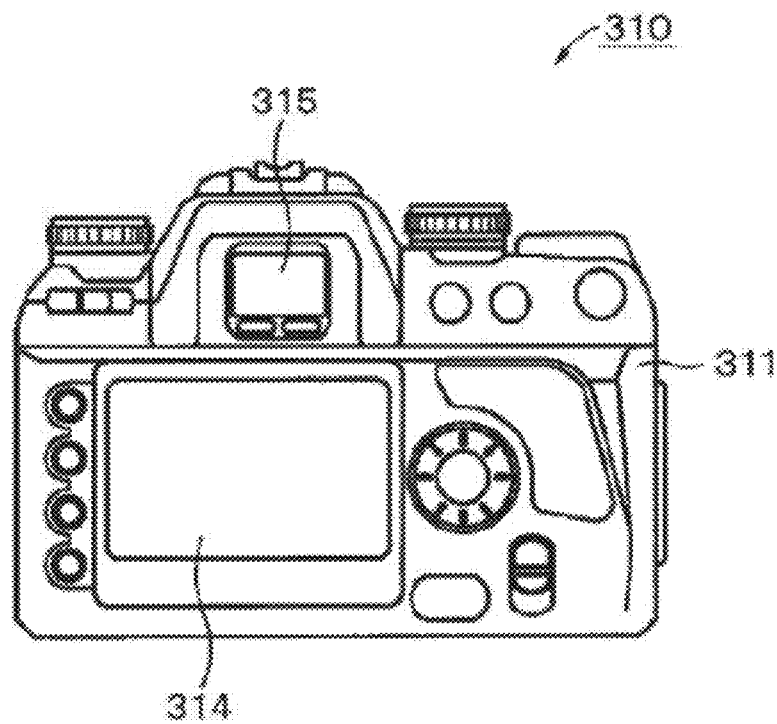
FIG. 30 is a rear view of a digital camera.

FIG. 29 is a front view of a digital camera 310 as a second application example of the display device 1, and FIG. 30 is a rear view of the digital camera 310. The digital camera 310 in FIGS. 29 and 30 illustrates an example of a single-lens reflex camera in which the lens 121 is replaceable, but is also applicable to a camera in which the lens 121 is not replaceable.

In the cameras of FIGS. 29 and 30, when the person who captures an image looks into the electronic viewfinder 315 to determine the composition while holding the grip 313 of the camera body 311, and presses the shutter while adjusting the focus, the captured image data is stored in the memory in the camera. As illustrated in FIG. 34B, a monitor screen 316 that displays the captured image data or the like and a live image or the like, and the electronic viewfinder 315 are disposed on the back side of the camera. Furthermore, there is a case where a sub screen that displays setting information such as a shutter speed and an exposure value is provided on the upper surface of the camera.

By disposing a sensor, in an overlapping manner, on the back surface side of the monitor screen 316, the electronic viewfinder 315, the sub screen, and the like that are used for the camera, the camera can be used as the display device 1 according to the present disclosure.

Third Application Example

The display device 1 according to the present disclosure can also be applied to a head-mounted display (hereinafter referred to as an HMD). An HMD can be used for VR, AR, mixed reality (MR), substitutional reality (SR), or the like.

Figure 31:
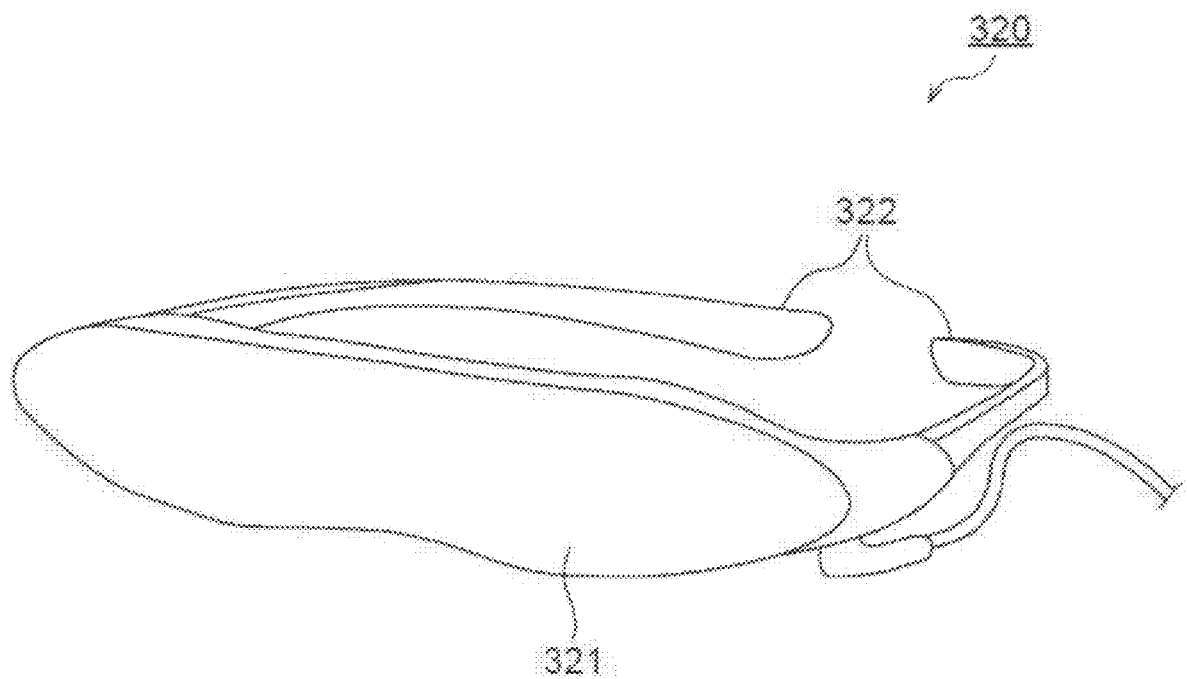
FIG. 31 is an external view of an HMD which is a third application example of an electronic apparatus.

FIG. 31 is an external view of an HMD 320 as a third application example of the display device 1. The HMD 320 of FIG. 31 includes an attachment member 322 to be attached so as to cover human eyes. The attachment members 322 are hooked and secured to human ears, for example. A display device 321 is provided inside the HMD 320, and the wearer of the HMD 320 can visually recognize a stereoscopic image and the like with the display device 321. The HMD 320 includes a wireless communication function and an acceleration sensor, for example, and can switch stereoscopic images or the like displayed on the display device 321 in accordance with a posture, a gesture, or the like of the wearer.

Furthermore, a camera may be disposed in the HMD 320 to capture an image around the wearer, and an image obtained by combining the image captured by the camera with an image generated by a computer may be displayed on the display device 321. For example, the camera is disposed to overlap with the back surface side of the display device 321 visually recognized by the wearer of the HMD 320, an image of the surroundings of the eyes of the wearer is captured with the camera, and the captured image is displayed on another display provided on the outer surface of the HMD 320, so that a person around the wearer can recognize the expression of the face and the movement of the eyes of the wearer in real time.

Figure 32:
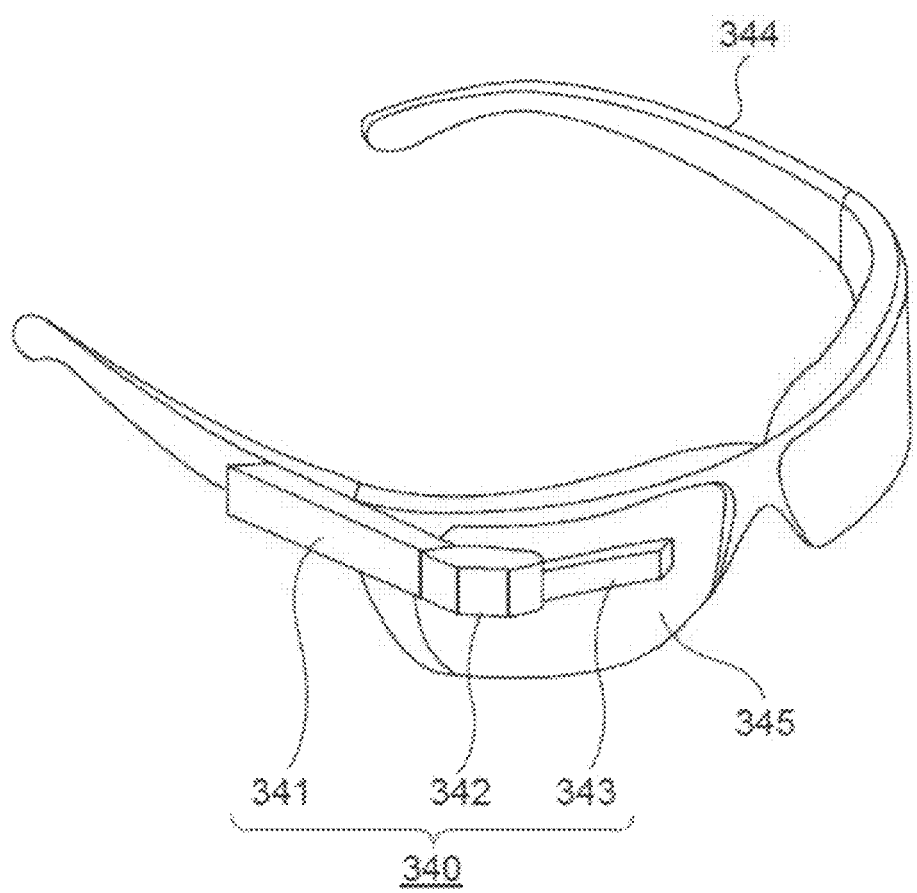
FIG. 32 is an external view of smart glasses.

Note that various types of HMD 320 are conceivable. For example, as illustrated in FIG. 32, the display device 1 according to the present disclosure can also be applied to smart glasses 340 that display various kinds of information on glasses 344. The smart glasses 340 in FIG. 32 includes a main body portion 341, an arm portion 342, and a lens barrel portion 343. The main body portion 341 is connected to the arm portion 342. The main body portion 341 is detachable from the glasses 344. The main body portion 341 includes a display unit and a control board for controlling operations of the smart glasses 340. The main body portion 341 and the lens barrel are connected to each other via the arm portion 342. The lens barrel portion 343 emits image light emitted from the main body portion 341 through the arm portion 342, to the side of lenses 345 of the glasses 344. This image light enters the human eyes through the lenses 345. The wearer of the smart glasses 340 in FIG. 35B can visually recognize not only a surrounding situation but also various pieces of information emitted from the lens barrel portion 343, similarly to conventional glasses.

Fourth Application Example

The display device 1 according to the present disclosure can also be applied to a television device (hereinafter referred to as a TV). In a today's TV, the frame tends to be as small as possible from the viewpoint of downsizing and design properties. Therefore, in a case where a camera to capture an image of a viewer is disposed on a TV, it is desirable to dispose the camera so as to overlap with the back surface side of a display panel 331 of the TV.

Figure 33:
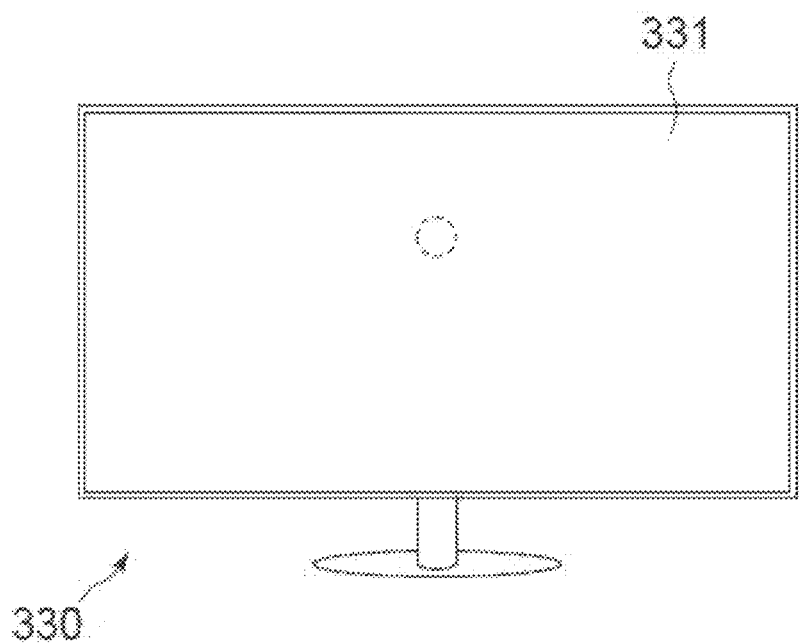
FIG. 33 is an external view of a TV which is a fourth application example of an electronic apparatus.

FIG. 33 is an external view of a TV 330 as a fourth application example of the display device 1. In the TV 330 in FIG. 33, the frame is minimized, and almost the entire region on the front side is the display area. The TV 330 includes a sensor such as a camera to capture an image of the viewer. The sensor in FIG. 36 is disposed on the back side of a portion (indicated by a dashed line, for example) in the display panel 331. The sensor may be an image sensor module, or various sensors can be used such as a sensor for face authentication, a sensor for distance measurement, and a temperature sensor. A plurality of kinds of sensors may be disposed on the back surface side of the display panel 331 of the TV 330.

As described above, with the display device 1 of the present disclosure, an image sensor module can be disposed to overlap with the back surface side of the display panel 331. Accordingly, there is no need to dispose a camera or the like on the frame, the TV 330 can be downsized, and there is no possibility that the design is impaired by the frame.

Fifth Application Example

Figure 34:
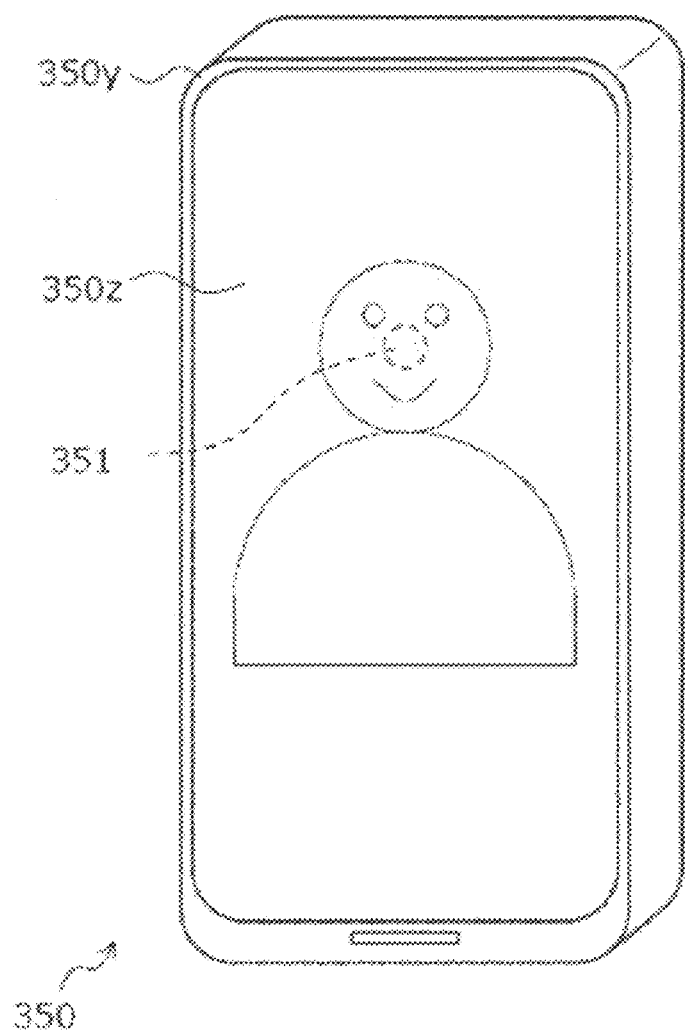
FIG. 34 is an external view of a smartphone which is a fifth application example of an electronic apparatus.

The display device 1 according to the present disclosure can also be applied to a smartphone and a mobile phone. FIG. 34 is an external view of a smartphone 350 as a fifth application example of the display device 1. In an example in FIG. 34, a display surface 350z covers nearly the outer shape size of the display device 1, and the width of a bezel 350y around the display surface 350z is set to several millimeters or smaller. In general, a front camera is often mounted on the bezel 350y. In FIG. 37, however, as indicated by a dashed line, an image sensor module 351 functioning as the front camera is disposed on the back surface side of a substantially central portion of the display surface 2z, for example. As the front camera is disposed on the back surface side of the display surface 2z in this manner, there is no need to dispose the front camera on the bezel 350y, and thus, the width of the bezel 350y can be narrowed.

Note that the present technology may have the following configurations.

(1)

A display device including:
a plurality of pixel circuits respectively connected to a plurality of data lines in a first direction;
a first voltage output unit that generates a first ramp wave voltage whose voltage level changes with time; and
a first ramp wiring that supplies the first ramp wave voltage generated by the first voltage output unit to each of a plurality of data lines of a first group,
in which at least two data lines of the plurality of data lines are brought into a conductive state before outputting the first ramp wave voltage to the first ramp wiring.

(2)

The display device according to (1), in which
the pixel circuit includes a light emitting unit and a drive circuit for driving the light emitting unit,
the drive circuit includes a drive transistor and a capacitance unit, and
a voltage corresponding to an image signal is held in the capacitance unit.

(3)

The display device according to (2), further including
a first switch that brings at least two data lines of the plurality of data lines into a conductive state or a non-conductive state,
in which at least two data lines among the plurality of data lines are brought into a conductive state by the first switch.

(4)

The display device according to (2), further including:
a second voltage output unit that generates a second ramp wave voltage whose voltage level changes with time; and
a second ramp wiring that supplies the second ramp wave voltage generated by the second voltage output unit to each of a plurality of data lines of a second group different from the plurality of data lines of the first group.

(5)
The display device according to (4), further including
a second switch that brings the first ramp wiring and the second ramp wiring into a conductive state or a non-conductive state,
in which at least two data lines among the plurality of data lines are brought into a conductive state by the second switch.

(6)
The display device according to (4), further including
a plurality of drive control lines that drives the drive transistor,
in which each of the plurality of drive control lines is connected to the drive transistor of each of a plurality of pixel circuits arranged in a second direction different from the first direction,
the plurality of data lines of the first group is connected to the pixel circuit including the drive transistor connected to at least a first drive control line among the plurality of drive control lines, and
the plurality of data lines of the second group is connected to at least a second drive control line different from the first drive control line among the plurality of drive control lines.

(7)
The display device according to (5), in which the first ramp wave voltage and the second ramp wave voltage are output at different timings.

(8)
The display device according to (2), in which the voltage corresponding to the image signal is set using the first ramp wave voltage.

(9)
The display device according to (3), in which the first switch is brought into a conductive state in a period according to the image signal.

(10)
The display device according to (2), in which the first ramp wave voltage includes a DC voltage for initialization and a ramp wave voltage for setting the image signal.

(11)
The display device according to (2), in which the first ramp wave voltage includes a ramp wave voltage for initialization and a ramp wave voltage for setting the image signal.

(12)
The display device according to (5), in which
the first ramp wave voltage includes a ramp wave voltage for initialization and a ramp wave voltage for setting the image signal, and the second ramp wave voltage includes a ramp wave voltage for initialization and a ramp wave voltage for setting the image signal, and
the second ramp wave voltage outputs a ramp wave voltage for setting the image signal according to timing at which the first ramp wave voltage outputs a voltage for initialization.

(13)
The display device according to (12), in which at least two data lines among the plurality of data lines are brought into a conductive state during a precharge period of a ramp wave voltage for initialization.

(14)
The display device according to (12), in which at least two data lines among the plurality of data lines are brought into a conductive state during a precharge period of a ramp wave voltage for setting the image signal.

(15)
The display device according to (12), in which the ramp wave voltage for initialization and the ramp wave voltage for setting the image signal are alternately output at a predetermined cycle.

(16)
The display device according to (12), in which the first ramp wave voltage is output to the first ramp wiring via a first buffer, and the second ramp wave voltage is output to the second ramp wiring via a second buffer.

(17)
The display device according to (16), in which at least one of the first buffer or the second buffer is set to high impedance in a period in which the two data lines are brought into a conductive state.

(18)
The display device according to (2), in which in a case where the two data lines are brought into a conductive state, accumulated charges of the capacitance unit included in the pixel circuit connected to each of the two data lines are shared.

Aspects of the present disclosure are not limited to the above-described individual embodiments, but include various modifications that can be conceived by those skilled in the art, and the effects of the present disclosure are not limited to the above-described contents. That is, various additions, modifications, and partial deletions are possible without departing from the conceptual idea and spirit of the present disclosure derived from the contents defined in the claims and equivalents thereof.

REFERENCE SIGNS LIST

1 Display device
2 Display system
3 Display controller
4 Timing controller
5 Data input
15, 200 Pixel circuit
34 Ramp signal generation circuit (voltage output unit)
36a, 36b, 36c Switch
39 Switch
42 Drive transistor
45 Capacitance unit
70a, 70b Data line
400 Drive circuit
CHD Capacitance unit
DNL1 to DNLn Data line
TRDrv Drive transistor
RAMPLINE_1 First ramp wiring
RAMPLINE_2 Second ramp wiring

The invention claimed is:
1. A display device comprising:
a plurality of pixel circuits respectively connected to a plurality of data lines in a first direction;
a first voltage output unit that generates a first ramp wave voltage whose voltage level changes with time; and
a first ramp wiring that supplies the first ramp wave voltage generated by the first voltage output unit to each of a plurality of data lines of a first group,
wherein at least two data lines of the plurality of data lines are brought into a conductive state before outputting the first ramp wave voltage to the first ramp wiring.

2. The display device according to claim 1, wherein
the pixel circuit includes a light emitting unit and a drive circuit for driving the light emitting unit,
the drive circuit includes a drive transistor and a capacitance unit, and a voltage corresponding to an image signal is held in the capacitance unit.

3. The display device according to claim 2, further comprising
a first switch that brings at least two data lines of the plurality of data lines into a conductive state or a non-conductive state,
wherein at least two data lines among the plurality of data lines are brought into a conductive state by the first switch.

4. The display device according to claim 3, wherein the first switch is brought into a conductive state in a period according to the image signal.

5. The display device according to claim 2, further comprising:
a second voltage output unit that generates a second ramp wave voltage whose voltage level changes with time; and
a second ramp wiring that supplies the second ramp wave voltage generated by the second voltage output unit to each of a plurality of data lines of a second group different from the plurality of data lines of the first group.

6. The display device according to claim 5, further comprising
a second switch that brings the first ramp wiring and the second ramp wiring into a conductive state or a non-conductive state,
wherein at least two data lines among the plurality of data lines are brought into a conductive state by the second switch.

7. The display device according to claim 6, further comprising
a plurality of drive control lines that drives the drive transistor,
wherein each of the plurality of drive control lines is connected to the drive transistor of each of a plurality of pixel circuits arranged in a second direction different from the first direction,
the plurality of data lines of the first group is connected to the pixel circuit including the drive transistor connected to at least a first drive control line among the plurality of drive control lines, and
the plurality of data lines of the second group is connected to at least a second drive control line different from the first drive control line among the plurality of drive control lines.

8. The display device according to claim 6, wherein the first ramp wave voltage and the second ramp wave voltage are output at different timings.

9. The display device according to claim 6, wherein
the first ramp wave voltage includes a ramp wave voltage for initialization and a ramp wave voltage for setting the image signal, and the second ramp wave voltage includes a ramp wave voltage for initialization and a ramp wave voltage for setting the image signal, and
the second ramp wave voltage outputs a ramp wave voltage for setting the image signal according to timing at which the first ramp wave voltage outputs a voltage for initialization.

10. The display device according to claim 9, wherein at least two data lines among the plurality of data lines are brought into a conductive state during a precharge period of a ramp wave voltage for initialization.

11. The display device according to claim 9, wherein at least two data lines among the plurality of data lines are brought into a conductive state during a precharge period of a ramp wave voltage for setting the image signal.

12. The display device according to claim 9, wherein the ramp wave voltage for initialization and the ramp wave voltage for setting the image signal are alternately output at a predetermined cycle.

13. The display device according to claim 9, wherein the first ramp wave voltage is output to the first ramp wiring via a first buffer, and the second ramp wave voltage is output to the second ramp wiring via a second buffer.

14. The display device according to claim 13, wherein at least one of the first buffer or the second buffer is set to high impedance in a period in which the two data lines are brought into a conductive state.

15. The display device according to claim 2, wherein the voltage corresponding to the image signal is set using the first ramp wave voltage.

16. The display device according to claim 2, wherein the first ramp wave voltage includes a DC voltage for initialization and a ramp wave voltage for setting the image signal.

17. The display device according to claim 2, wherein the first ramp wave voltage includes a ramp wave voltage for initialization and a ramp wave voltage for setting the image signal.

18. The display device according to claim 2, wherein in a case where the two data lines are brought into a conductive state, accumulated charges of the capacitance unit included in the pixel circuit connected to each of the two data lines are shared.

* * * * *